(12) United States Patent
Row et al.

(10) Patent No.: US 9,865,956 B2
(45) Date of Patent: Jan. 9, 2018

(54) ELECTRICAL POP OUT DEVICE WITH ELECTRICAL OUTLETS AND/OR USB PORTS

(71) Applicant: The Wiremold Company, West Hartford, CT (US)

(72) Inventors: Gordon D. Row, Groton, MA (US); Mark Makwinski, Cromwell, CT (US)

(73) Assignee: The Wiremold Company, West Hartford, CT (US)

(*) Notice: Subject to any disclaimer, the term of this patent is extended or adjusted under 35 U.S.C. 154(b) by 0 days.

(21) Appl. No.: 15/005,473

(22) Filed: Jan. 25, 2016

(65) Prior Publication Data

US 2016/0141787 A1 May 19, 2016

Related U.S. Application Data

(63) Continuation of application No. 14/107,779, filed on Dec. 16, 2013, now Pat. No. 9,247,657, which is a continuation-in-part of application No. 13/957,044, filed on Aug. 1, 2013, now Pat. No. 8,864,507, which is a continuation of application No. 13/735,260, filed on Jan. 7, 2013, now Pat. No. 8,684,755, which is a continuation of application No. 12/913,956, filed on Oct. 28, 2010, now Pat. No. 8,348,683, said application No. 14/107,779 is a continuation-in-part of application No. 13/396,993, filed on Feb. 15, 2012, now Pat. No. 8,610,313, which is a continuation of application No. 12/513,256, filed as application No.

(Continued)

(51) Int. Cl.
*H01R 13/44* (2006.01)
*H01R 13/60* (2006.01)
*H05K 5/00* (2006.01)
*H01R 25/00* (2006.01)
*H02G 3/12* (2006.01)
*H01R 13/516* (2006.01)
*H01R 27/02* (2006.01)

(52) U.S. Cl.
CPC .......... *H01R 13/44* (2013.01); *H01R 13/516* (2013.01); *H01R 25/006* (2013.01); *H01R 27/02* (2013.01); *H02G 3/12* (2013.01); *H05K 5/0073* (2013.01)

(58) Field of Classification Search
CPC ...... H01R 35/04; H01R 23/025; H01R 13/44; H01R 13/4538; H01R 13/6395; H01R 41/00; H01R 25/006; H02G 3/14; H02G 3/088
USPC ............. 439/131, 536, 535, 32; 174/480, 66
See application file for complete search history.

(56) References Cited

U.S. PATENT DOCUMENTS 6,478,587 B2 * 11/2002 Sharples .............. H01R 13/447
174/480
6,854,989 B2 * 2/2005 Milan ................ H01R 13/6658
439/131

(Continued)

*Primary Examiner* — Hae Moon Hyeon
(74) *Attorney, Agent, or Firm* — McCormick, Paulding & Huber LLP

(57) ABSTRACT

An electrical pop out device has a shroud and an outlet housing. The outlet housing is sized to be placed inside the shroud. A guidance mechanism connects the outlet housing with the shroud. The guidance mechanism includes multiple rack gears and multiple pinion gears. The outlet housing is moveable with respect to the shroud along a direction defined by the rack gear. A spring connector electrically couples the shroud to the outlet housing.

21 Claims, 25 Drawing Sheets

Related U.S. Application Data

PCT/US2007/023575 on Nov. 8, 2007, now Pat. No. 8,134,254.

(60) Provisional application No. 60/858,130, filed on Nov. 9, 2006.

(56) References Cited

U.S. PATENT DOCUMENTS

| | | | | |
|---|---|---|---|---|
| 6,943,296 | B2 | 9/2005 | Perrella et al. | |
| 6,981,887 | B1 * | 1/2006 | Mese | H01R 24/62 439/244 |
| 7,530,823 | B1 * | 5/2009 | Thornton | H01Q 1/2275 439/131 |
| 7,938,679 | B2 * | 5/2011 | Wadsworth | H01R 13/74 439/574 |
| 7,997,925 | B2 * | 8/2011 | Lam | H01R 13/665 174/66 |
| 8,134,254 | B2 * | 3/2012 | Makwinski | G06F 1/26 307/122 |
| 8,610,313 | B2 * | 12/2013 | Makwinski | G06F 1/26 307/122 |
| 8,851,909 | B2 * | 10/2014 | Shammoh | H01R 25/006 439/134 |
| 9,247,657 | B2 * | 1/2016 | Row | H01R 13/516 |
| 2012/0292991 | A1 * | 11/2012 | Dodal | H02H 3/16 307/11 |

* cited by examiner

ELECTRICAL POP OUT DEVICE WITH ELECTRICAL OUTLETS AND/OR USB PORTS

CROSS REFERENCE TO RELATED APPLICATIONS

This application is a continuation of application Ser. No. 14/107,779, which is a continuation-in-part of application Ser. No. 13/957,044 filed Aug. 1, 2013, which is a continuation of application Ser. No. 13/735,260 filed Jan. 7, 2013, which is a continuation of application Ser. No. 12/913,956 filed Oct. 28, 2010, now U.S. Pat. No. 8,348,683, the contents of which are all of incorporated herein by reference. Application Ser. No. 14/107,779 is also a continuation-in-part of application Ser. No. 13/396,993 filed on Feb. 15, 2012, which is a continuation of application Ser. No. 12/513,256 filed on May 1, 2009, now U.S. Pat. No. 8,134,254, which is the National Stage of International Application No. PCT/US07/23575 filed on Nov. 8, 2007, which claims the benefit of Provisional Application No. 60/858,130 filed on Nov. 9, 2006, the contents of which are all of incorporated herein by reference.

TECHNICAL FIELD

The present application relates to an electrical wall socket and, more particularly, to an electrical pop out device that is capable of being installed flush with a wall and then extending from the wall to expose electrical outlets along a multitude of different surfaces.

BACKGROUND

An electrical socket is the female portion of an electrical connector that accepts and delivers electrical current to the prongs of inserted plugs. Electrical sockets are well known in the art. Existing electrical sockets are generally known to be attached to a wall or other similar structure in a semi-permanent manner.

The attached electrical socket, generally having multiple outlets, is typically installed in a manner that allows the outlets to be substantially flush with the wall or other structure. There are several problems associated with the electrical wall sockets having outlets flush with the wall. First, only a limited number of outlets can be arranged along any single surface. Second, many current plugs are equipped with surge protectors or adapter converters, which increase the overall size of the plug and cause the oversized plug to overlap additional outlets to render the overlapped outlets unusable.

Accordingly, there is a need for an improved electrical wall socket.

SUMMARY

According to one embodiment, an electrical pop out device has an enclosure and an outlet housing sized to be placed inside the enclosure. A guidance mechanism connects the outlet housing with the enclosure and allows movement of the outlet housing, with respect to the enclosure, between a compressed position and in an expanded position. The guidance mechanism includes multiple rack and pinion gear sets. Movement of the outlet housing is restricted to a direction defined by the rack gears.

A spring connector electrically couples the enclosure to the outlet housing. The spring connector has a first end connected with the enclosure and a second end connected with the outlet housing. The first end of the spring connector is perpendicular to the second end of the spring connector. The spring connector is compressible and expandable along two perpendicular directions.

The electrical pop out device includes an electrical connector for attaching the electrical pop out device to an electrical circuit. The electrical connector may be coupled to the enclosure and connected with the spring connector.

The outlet housing includes at least one pair of outlets placed about the outlet housing, such that access to each of the pair of outlets is provided from different directions.

The electrical pop out device may include a push-push latch operatively connected with the enclosure and the outlet housing.

These and other objects, features, and advantages will become apparent in light of the following detailed description of non-limiting embodiments, with reference to the accompanying drawings.

DETAILED DESCRIPTION OF PREFERRED EMBODIMENTS

Figure 1:
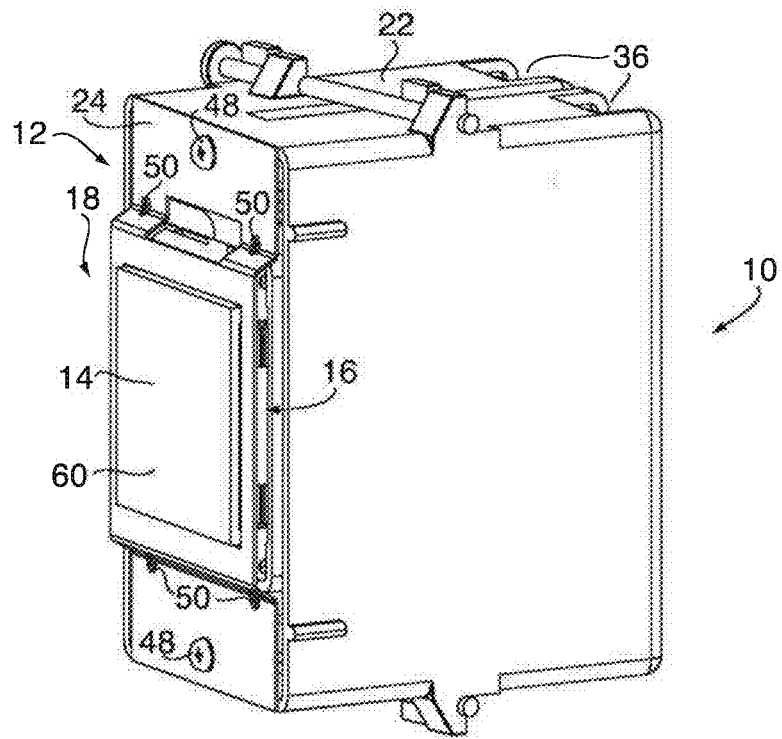
FIG. 1 is a perspective view of an electrical pop out device with an outlet housing being in a compressed position.
Figure 2:
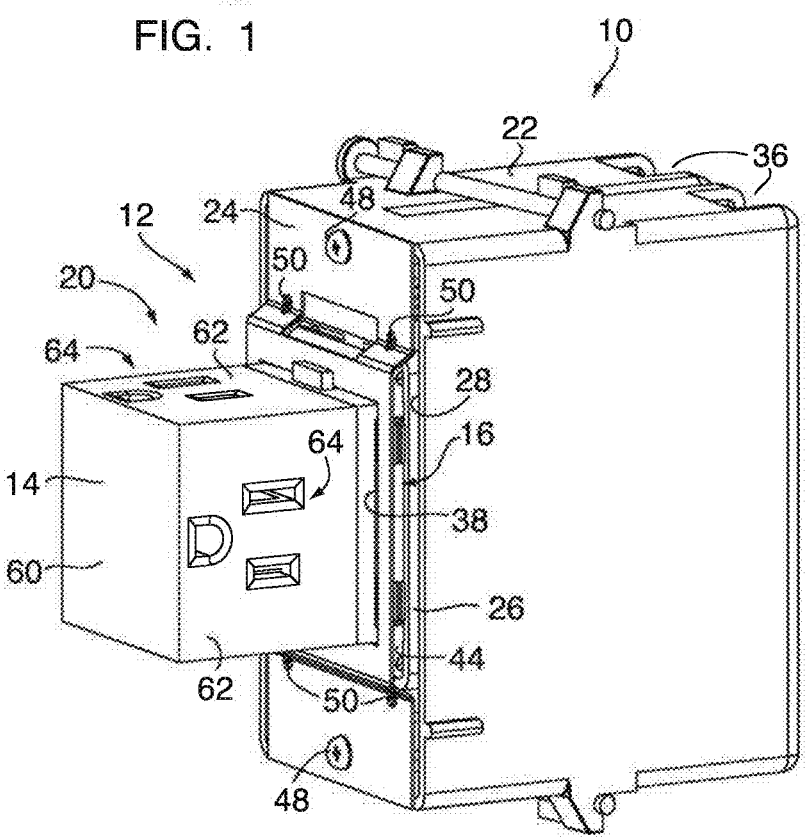
FIG. 2 is a perspective view of the electrical pop out device of FIG. 1 with an outlet housing being in an expanded position.

Referring to FIGS. 1 & 2, an electrical pop out device 10 includes an enclosure 12 and an outlet housing 14. The enclosure 12 is connected with the outlet housing 14 by a guidance mechanism 16. The guidance mechanism 16 allows movement of the outlet housing 14, with respect to the enclosure 12, between a compressed position 18, located within the enclosure, as illustrated in FIG. 1, and an expanded position 20, extending from the enclosure, as illustrated in FIG. 2.

Figure 3:
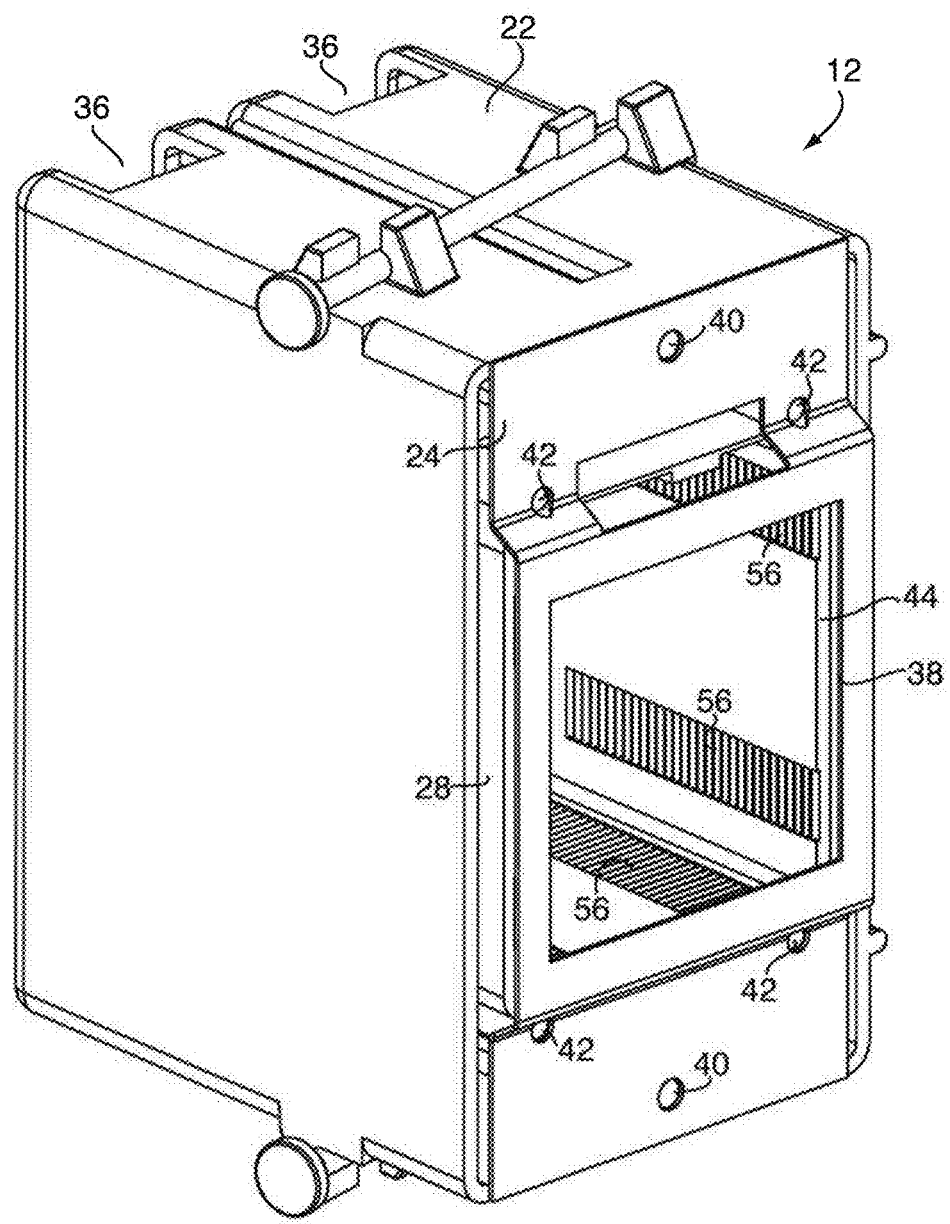
FIG. 3 is a perspective view of an enclosure of the electrical pop out device of FIGS. 1 and 2.
Figure 4:
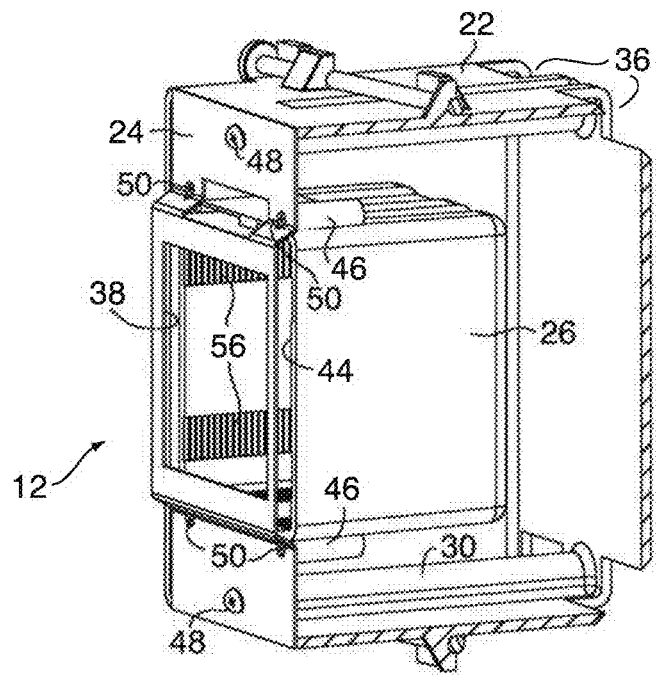
FIG. 4 is a partial cutaway view of the enclosure of the electrical pop out device of FIG. 3.
Figure 5:
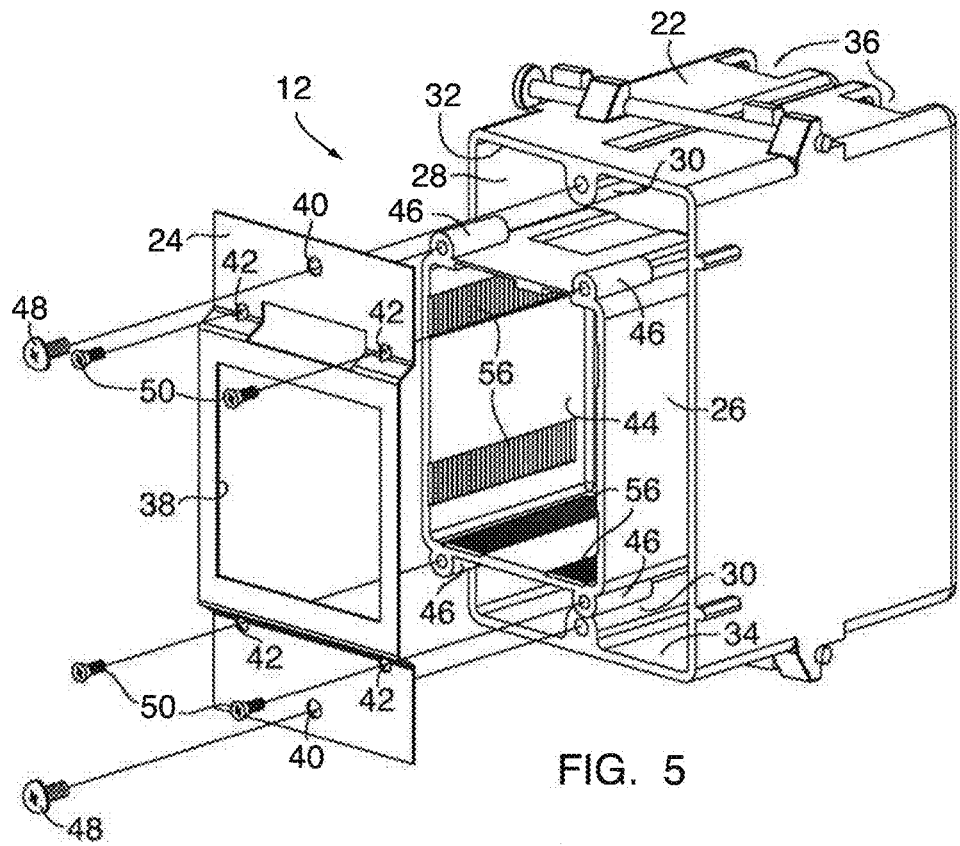
FIG. 5 is a exploded view of the enclosure of the electrical pop out device of FIGS. 3 and 4.

Referring to FIGS. 3-5, the enclosure 12 includes a sub-plate 24 and a shroud 26. The shroud 26 is sized to fit within a single gang or wall box 22. The wall box 22 is a standard single wall box defining an opening 28, wall box channels 30 along a top 32 and a bottom 34 of the wall box 22, and openings 36 for electrical wires (not shown for clarity). The sub-plate 24 defines a central cutout 38, two wall box holes 40, and a plurality of shroud holes 42. The shroud 26 is a box structure that defines an opening 44 and a plurality of shroud channels 46. With specific reference to FIG. 5, the wall box channels 30 of the wall box 22 align with the wall box holes 40 and are capable of receiving a screw 48 therethrough to couple the sub-plate 24 to the wall box 22. The plurality of shroud holes 42 align with the plurality of shroud channels 46 about the shroud 26 and are capable of receiving a set of screws 50 therethrough to couple the shroud 26 to the sub-plate 24.

Figure 6:
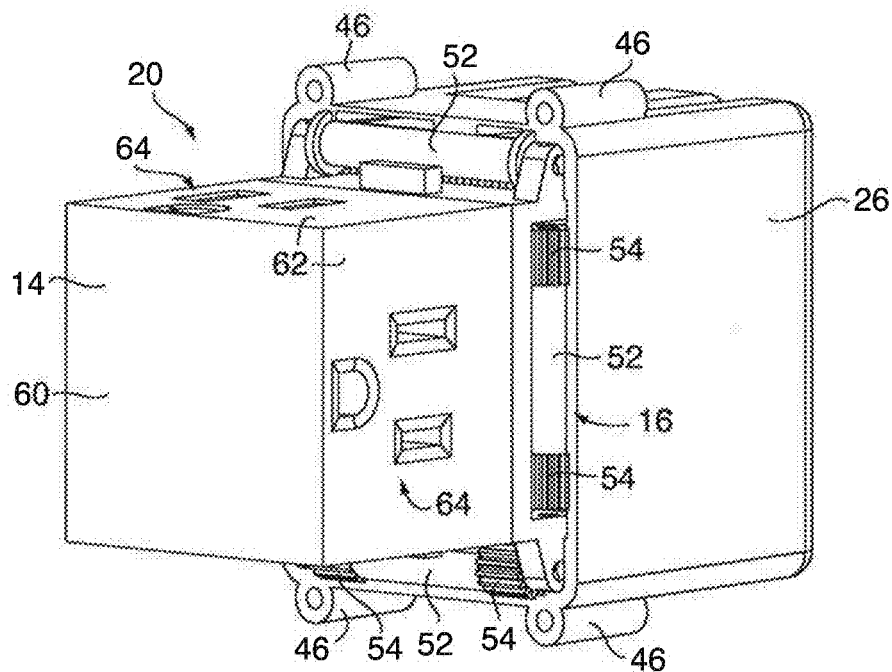
FIG. 6 is a perspective view of the outlet housing extending from a shroud of the enclosure of FIG. 2.
Figure 7:
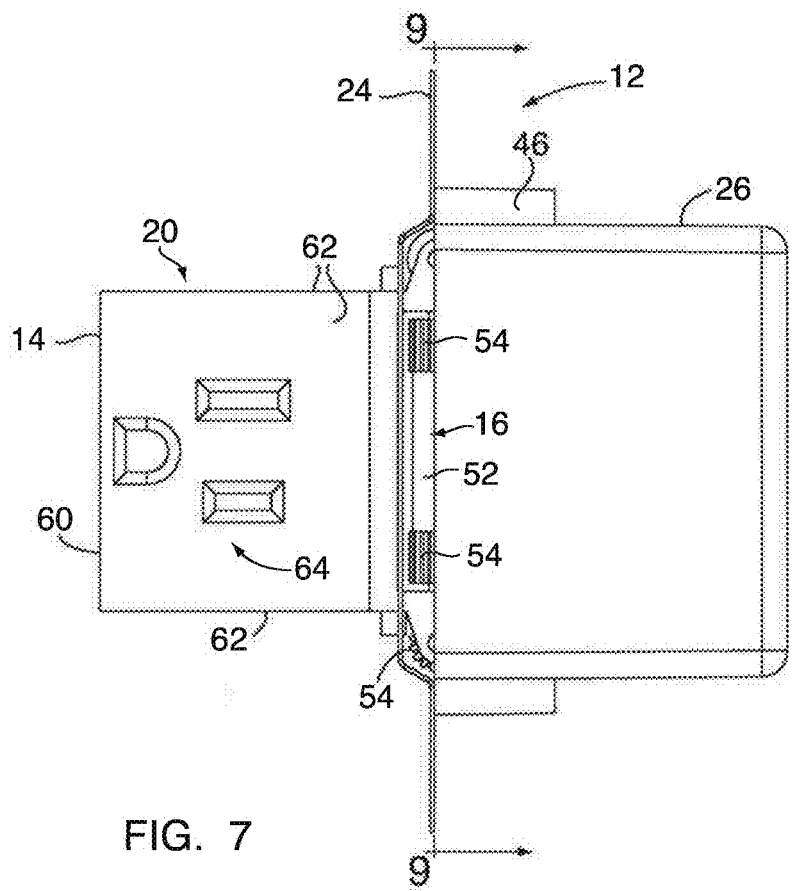
FIG. 7 is a side view of the outlet housing, sub-plate, and shroud.
Figure 8:
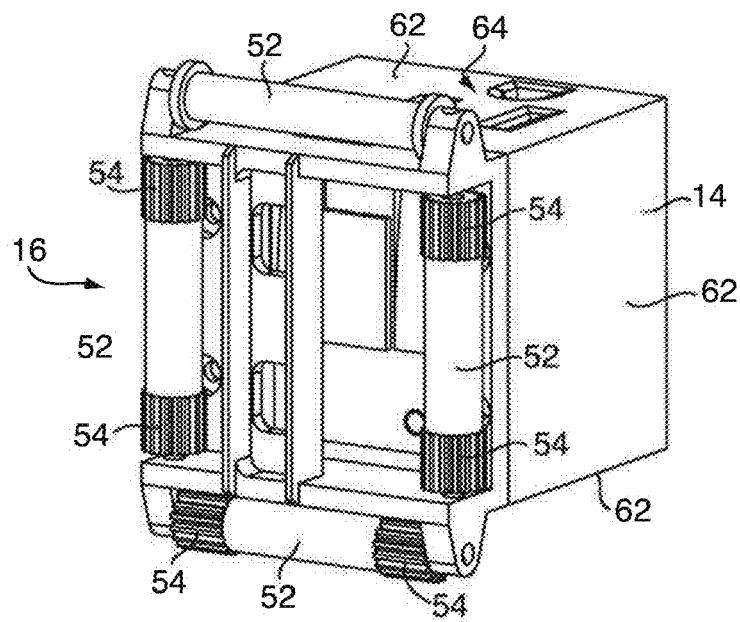
FIG. 8 is a rear perspective view of the outlet housing having a plurality of guide rollers of a guidance mechanism attached thereto.

Referring to FIG. 6, the guidance mechanism 16 couples the outlet housing 14 to the shroud 26. Referring to FIG. 7, the sub-plate 24 retains the guidance mechanism 16 within the shroud 26, and the outlet housing 14 within the enclosure 12. Referring to FIG. 8, the guidance mechanism 16 includes a plurality of guide rollers 52 rotatably attached to the outlet housing 14. As shown, one embodiment includes four (4) rollers and three of the guide rollers 52 include pinion gears 54.

Figure 9:
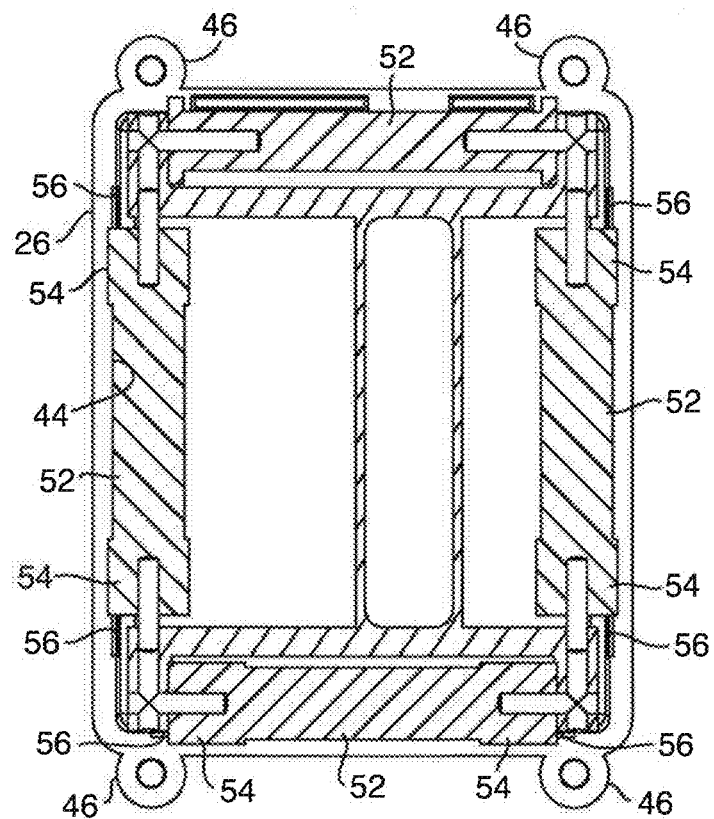
FIG. 9 is a section view of the electrical pop out device taken along line 9-9 of FIG. 7.
Figure 10:
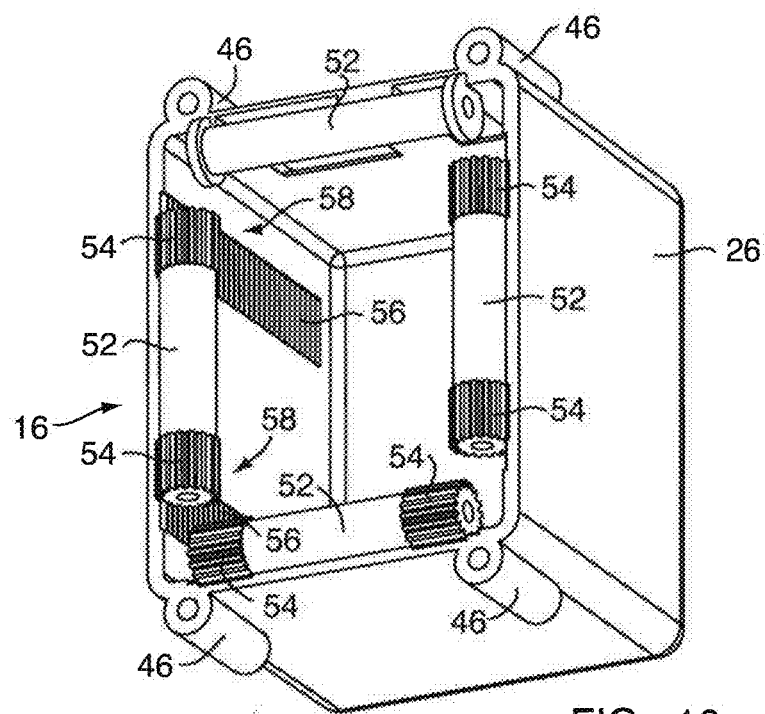
FIG. 10 is a perspective view of the shroud with racks and guide rollers of the guidance mechanism.
Figure 11:
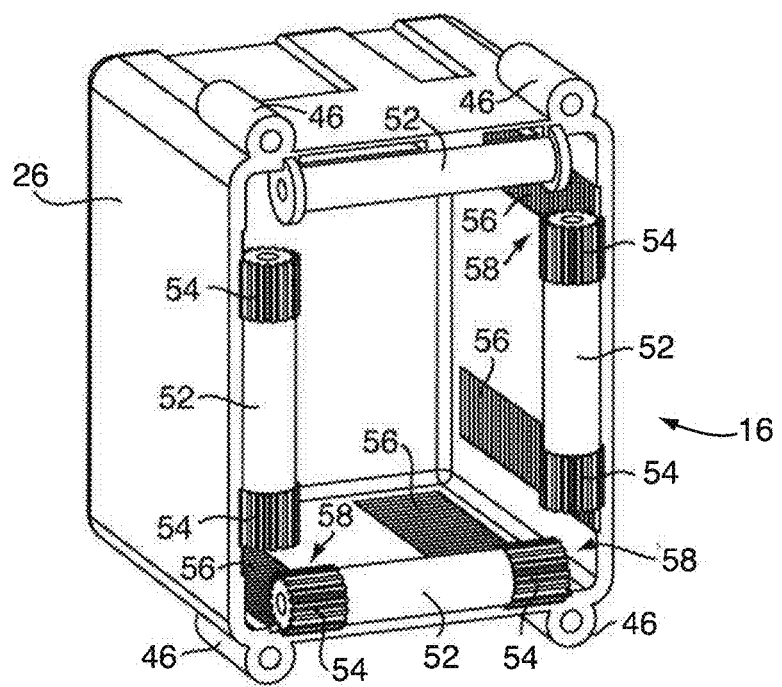
FIG. 11 is a perspective view of the shroud with racks and guide rollers of the guidance mechanism.

Referring to FIGS. 9-11, each pinion gear 54 mates with a rack gear 56 disposed on the shroud 26 to form a rack and pinion gear set 58. At least two of the rack and pinion gear sets 58 are diametrically opposed and at least two of the rack and pinion gear sets 58 are orthogonally arranged about the outlet housing 14. Each rack gear 56 extends from the opening 44 of the shroud 26 straight back into the shroud 26 to define a single direction and restricts movement of the outlet housing 14 to along the single direction. Specifically, the movement of the outlet housing 14 is restricted to in and out of the shroud 26 and is not permitted to moved up, down, or sideways with respect to the shroud.

The rack and pinion gear sets 58 are arranged about the outlet housing 14 to counteract a load applied to any of the sides of the outlet housing 14. The diametrically opposed rack and pinion gear sets 58 act to maintain the outlet housing 14 in top to bottom alignment. The orthogonally arranged rack and pinion gear sets 58 act to maintain the outlet housing 14 in top to bottom alignment and in side to side alignment.

Figure 12:
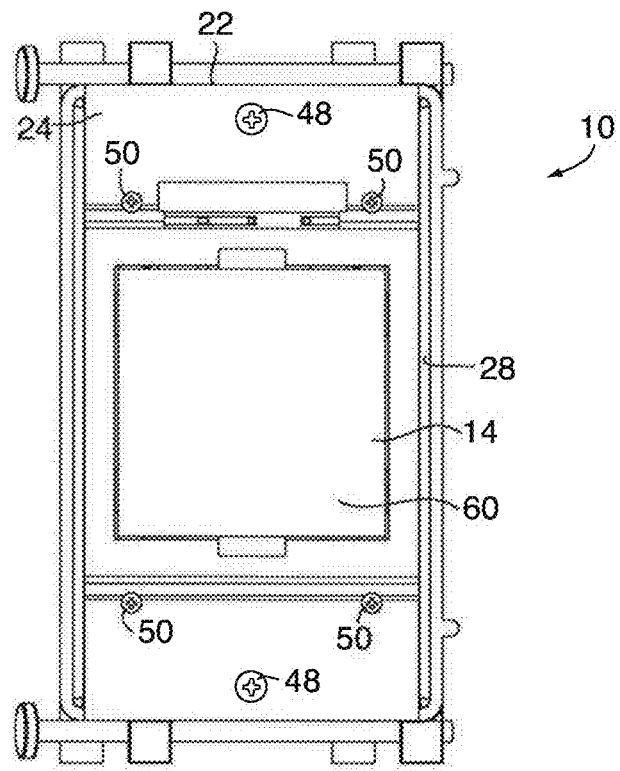
FIG. 12 is a front view of the electrical pop out device of FIG. 2.
Figure 13:
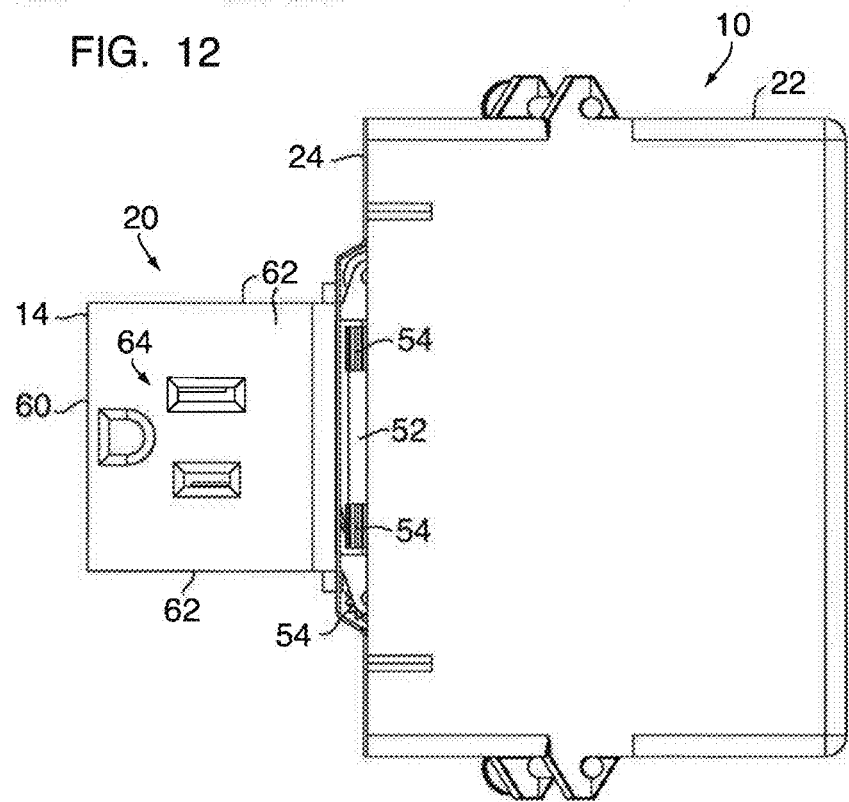
FIG. 13 is a side view of an electrical pop out device of FIG. 2 with the outlet housing being in an expanded position.

Referring to FIGS. 12 and 13, the outlet housing 14 is cube shaped and includes a front face 60 and four side faces 62. With additional reference to FIG. 2, the outlet housing 14 includes a plurality of outlets 64 placed on at least two of the side faces 62.

Figure 14:
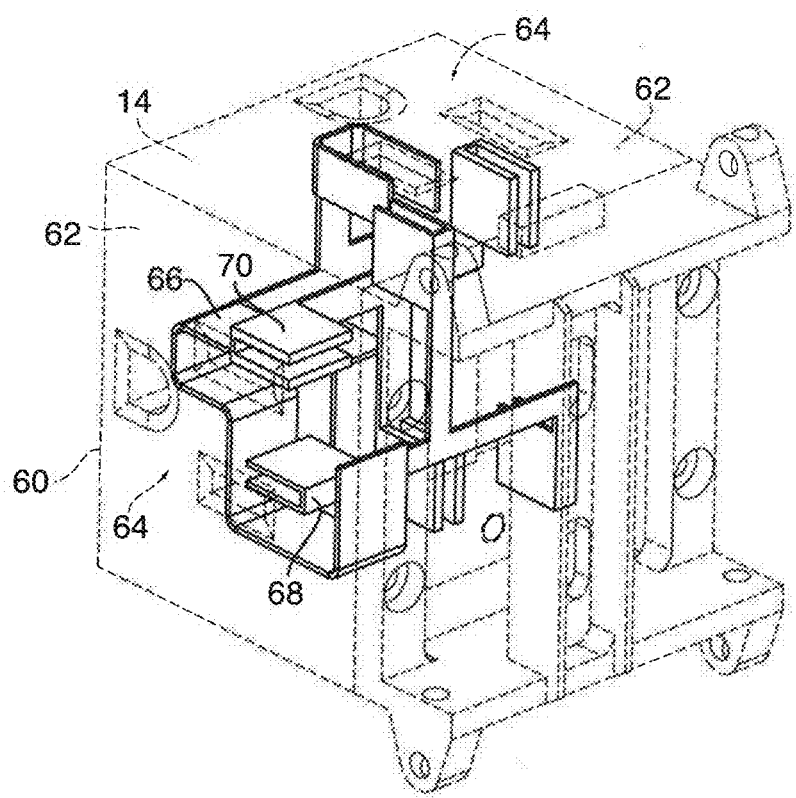
FIG. 14 is a perspective view of a set of contacts located within the outlet housing.
Figure 15:
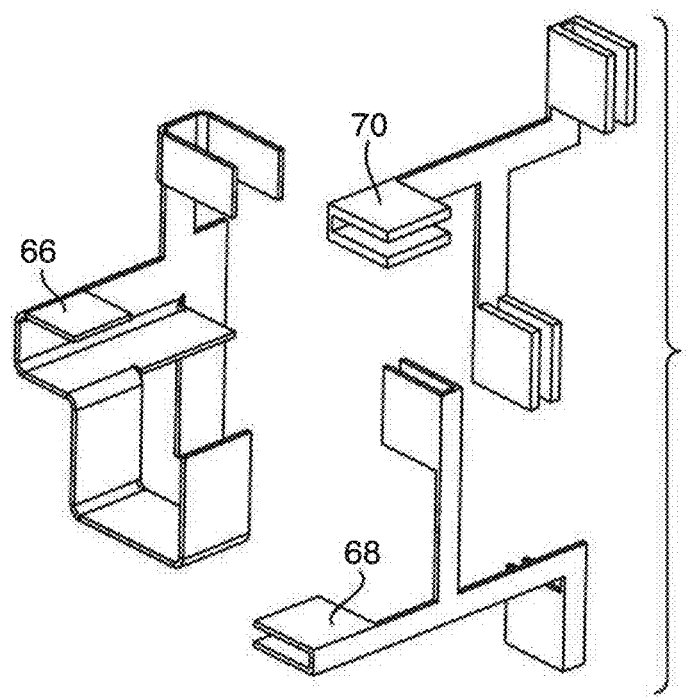
FIG. 15 is an exploded view of the set of contacts.
Figure 16:
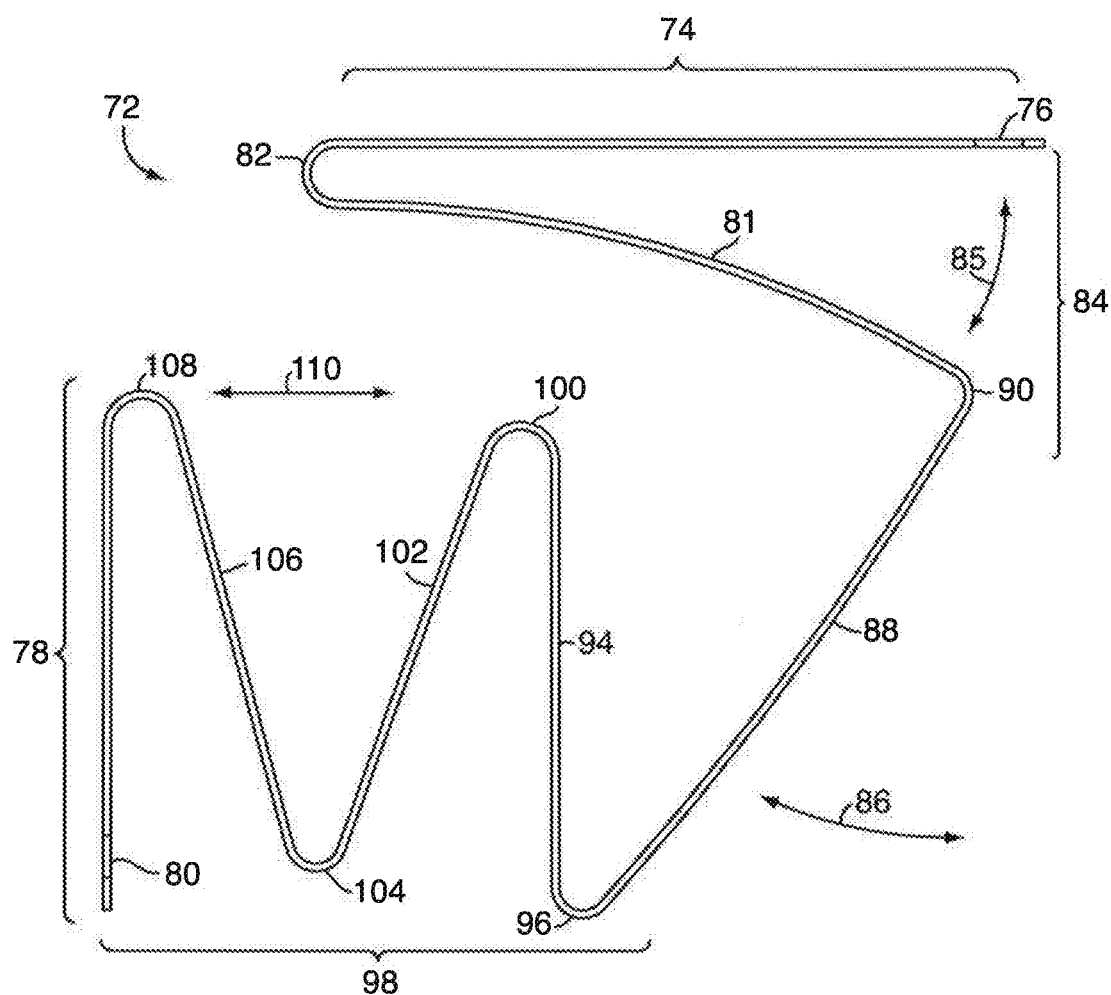
FIG. 16 is a side view of a spring connector.

In one embodiment, the outlet housing 14 includes three (3) outlets 64 that are arranged about different side faces 62 to provide access to each of the plurality of outlets 64 from a different direction. Referring to FIGS. 14 and 15, there are three (3) contacts located within the outlet housing 14. The three (3) contacts include a ground contact 66, a hot contact 68, and a neutral contact 70. Each contact 66, 68, and 70 is a shaped, electrically conductive structure that is connected with each of the outlets 64.

Referring to FIGS. 16-19, the electrical pop out device 10 includes a plurality of spring connectors 72. In one embodiment, the electrical pop out device 10 includes three (3) spring connectors 72, one (1) spring connector 72 connected with each of the contacts 66, 68, and 70. The spring connectors 72 function as both a mechanical means for ejecting the outlet housing 14 from within the shroud 26 and as electrical conductors to the contacts 66, 68, and 70. With specific reference to FIG. 16, each spring connector 72 includes a first end portion 74 terminating in a first end 76 and a second end portion 78 terminating in a second end 80. The first end portion 74 is substantially perpendicular to the second end portion 78. The first end 76 is connected with the enclosure 12 and the second end 80 is connected with one of the contacts 66, 68, or 70 of the outlet housing 14. The spring connectors 72 electrically couple the enclosure 12 to the contacts 66, 68, and 70 of the outlet housing 14 by conducting an electrical current from the first end portion 74 to the second end portion 78.

The spring connector 72 includes a first leg 81 connected with the first end portion 74 by a first bend 82. The first leg 81 is able to rotate, with respect to the first end portion 74, about the first bend 82 to form a first zone of expansion and compression 84, which defines a first mode of deflection 85.

The first leg 81 is connected with a second leg 88 by a second bend 90. The second leg 88 is able to rotate about the second bend 90 to define a second mode of deflection 86.

The second leg 88 is connected with a third leg 94 by a third bend 96. The third leg 94 and the second end portion 78 are connected through a second zone of expansion and compression 98 that includes the third leg 94, a fourth bend 100, a fourth leg 102, a fifth bend 104, a fifth leg 106, a sixth bend 108, and the second end portion 78. The second zone of expansion and compression 98 defines a third mode of deflection 110. The first zone of expansion and compression 84 is substantially perpendicular to the second zone of expansion and compression 98.

In one embodiment, the spring connector 72 is fabricated from a beryllium copper strip. However, it is contemplated that the spring connector 72 may be fabricated from another material that possess both conductive and elastically deformable qualities that are subject to good cycling.

Figure 18:
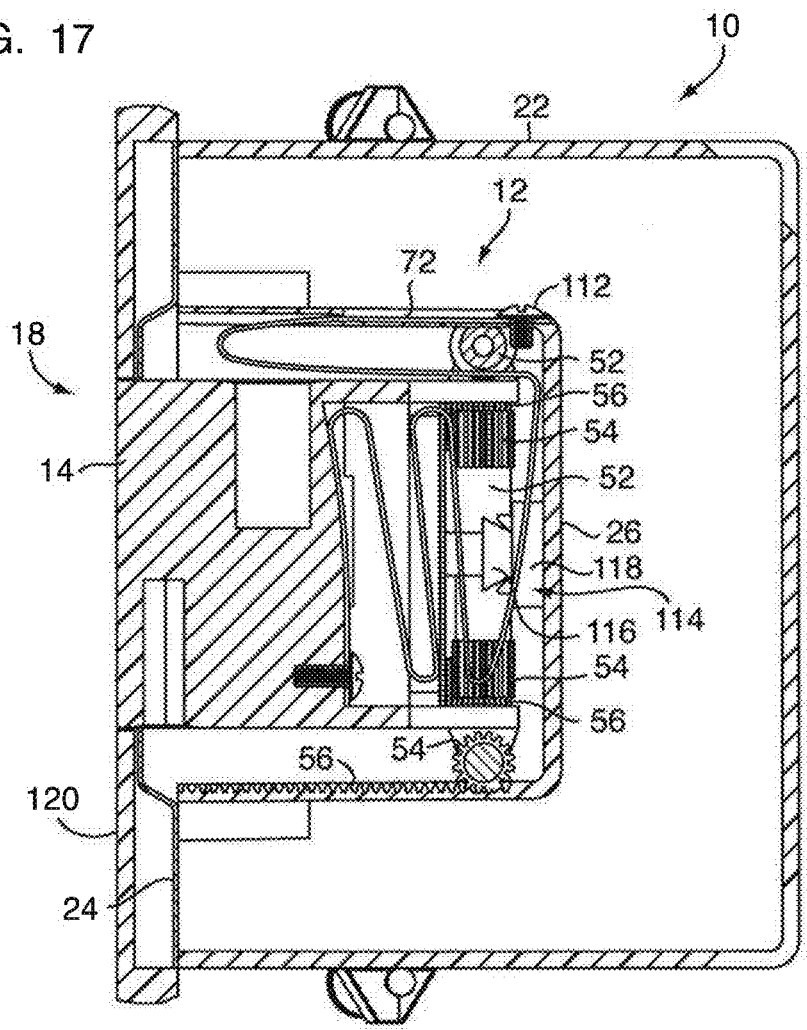
FIG. 18 is a section view of the electrical pop out device taken along line 18-18 of FIG. 17, the outlet housing being in the compressed position.
Figure 19:
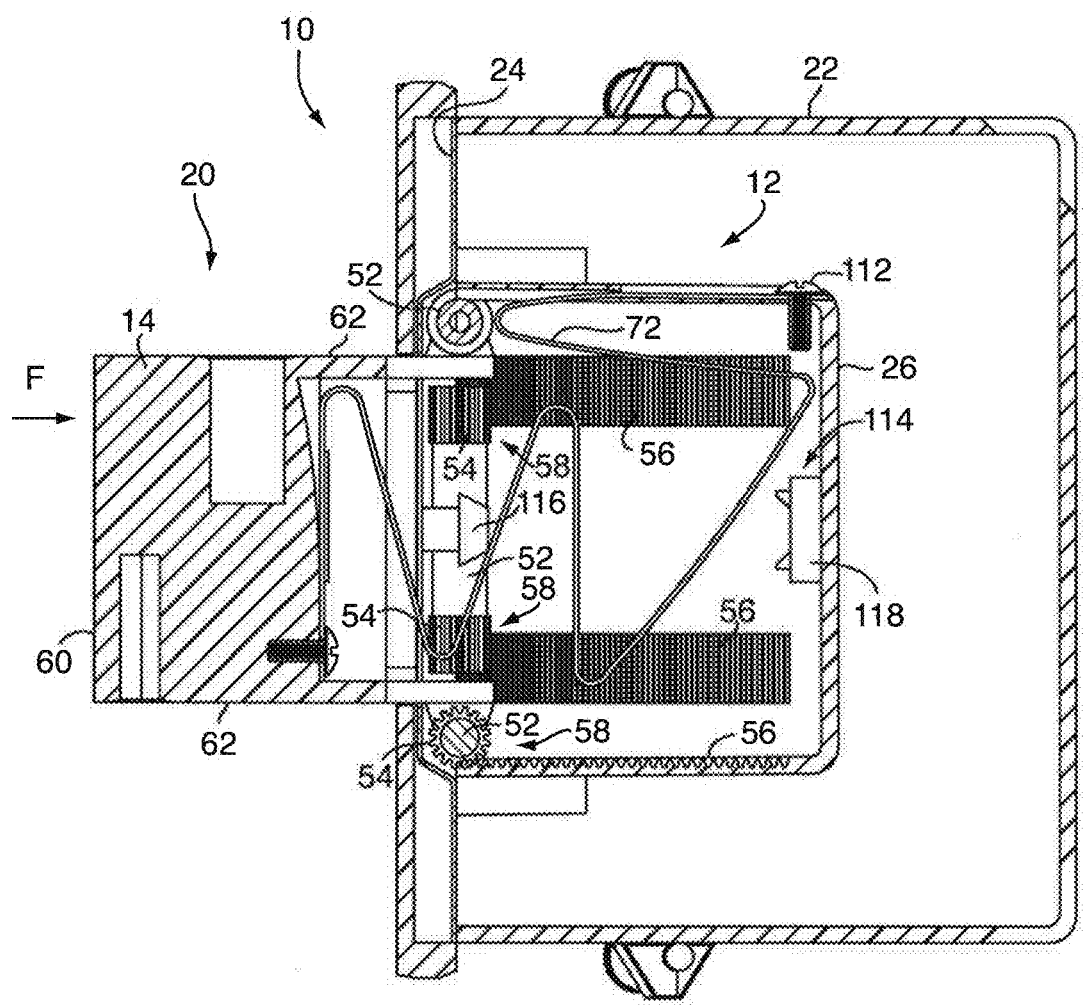
FIG. 19 is a section view of the electrical pop out device taken along line 18-18 of FIG. 17, the outlet housing being in the expanded position.

With specific reference to FIGS. 18 and 19, the electrical pop out device 10 includes an electrical connector 112 for attaching the electrical pop out device 10 to the electrical wires (not shown for clarity). In the embodiment, the electrical connector 112 is coupled to the shroud 26 of the enclosure 12 and is connected with the spring connector 72.

The electrical pop out device 10 includes a push-push latch 114 operatively connected with the enclosure 12 and the outlet housing 14. The push-push latch 114 includes a latch pin portion 116 and a latch pin receptacle portion 118.

In the embodiment, the latch pin portion 116 is attached to the outlet housing 14 and points back into the enclosure 12 from the rear of the outlet housing 14. The latch pin receptacle portion 118 is attached to the enclosure 12 and opens toward the latch pin portion 116. The latch pin portion 116 and the latch pin receptacle portion 118 are aligned, so that when the outlet housing 14 is in the compressed position 18, as shown in FIG. 18, the latch pin portion 116 is within the latch pin receptacle portion 118.

Figure 17:
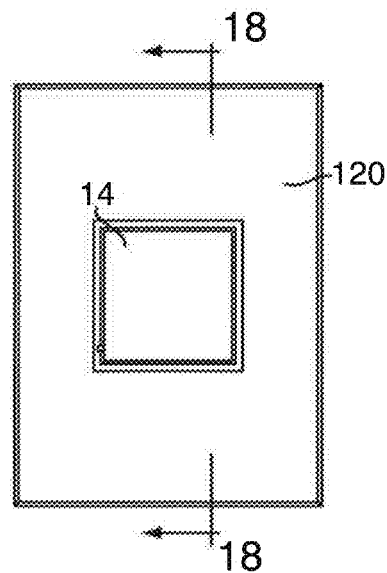
FIG. 17 is a front view of the electrical pop out device of FIG. 1 with a faceplate.

With specific reference to FIGS. 17 and 18, when the electrical pop out device 10 is not being utilized, such that the outlet housing 14 is in the compressed position, the front face 60 is substantially flush with an outer surface of a wall. An optional faceplate 120 may then be installed over the electrical pop out device 10 and the outer surface of the wall.

Referring back to FIGS. 18-19, the spring connector 72 is in an initial preloaded state to maintain the outlet housing 14 in the expanded position 20. To operate, a force 'F', as shown in FIG. 19, is applied to the front face 60 of the outlet housing 14 to move the outlet housing 14 from the expanded position 20 to the compressed position 18, which translates the outlet housing 14 into the enclosure 12, as shown in FIG. 18. The force 'F' must be greater than the spring force of the spring connector 72. The movement of the outlet housing 14 to the compressed position 18 causes the spring connector 72 to be compressed and to elastically deform along the three modes of deflection 85, 86, and 110.

During the first mode of deflection 85, the first leg 81 is rotated about the first bend 82 and the second bend 90 is forced to move proximally toward the first end 76. As a result, the second leg 88 and the second zone of expansion and compression 98 are also moved proximally with respect to the first end 76. During the second mode of deflection 86, the second leg 88 is rotated about the second bend 90, which causes the second zone of expansion and compression 98 to be moved proximally further with respect to the first end 76. During the third mode of deflection 110, the third leg 94 is rotated about the third bend 96 and the second zone of expansion and compression 98 is compressed causing the second end 80 to be moved proximally further with respect to the first end 76.

Once the outlet housing 14 is pushed into the compressed position 18, the push-push latch 114 removably retains the outlet housing 14 within the enclosure 12. The latch pin receptacle portion 118 is movable from a first position, when the outlet housing 14 is in the expanded position 20, to a second position, when the outlet housing 14 is in the compressed position 18. While in the first position, the latch pin portion 116 is free to move into the latch pin receptacle portion 118. While in the second position, the latch pin portion 116 is removably captured within the latch pin receptacle portion 118 and is prevented from moving with respect to the latch pin receptacle portion 118. Another application of the force 'F' opens the latch pin receptacle portion 118 and allows the latch pin portion 116 to be removed from within the latch pin receptacle portion 118, as the outlet housing 14 is extended from the enclosure 12 by the force of the spring connector 72.

Figure 20:
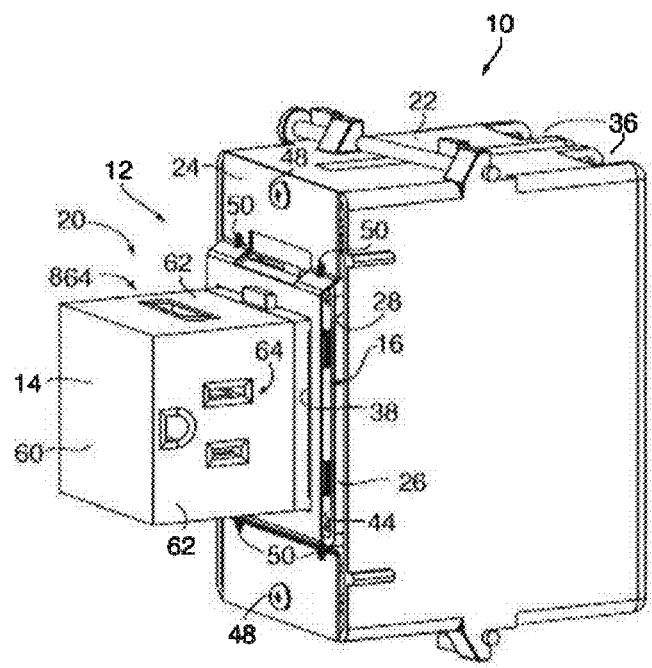
FIG. 20 is a perspective view of another embodiment of an electrical pop out device with an outlet housing being in an expanded position.
Figure 21:
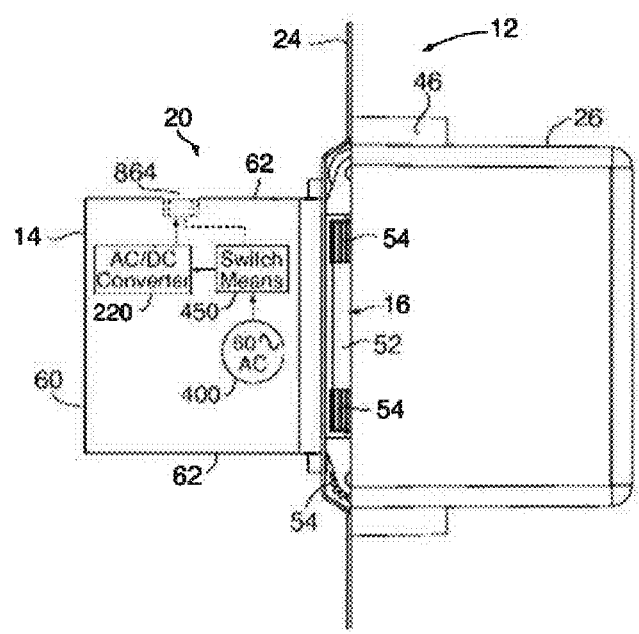
FIG. 21 is a side view of the outlet housing, sub-plate, and shroud of the electrical pop out device of FIG. 20.

Another embodiment of an electrical pop out device 10 is shown in FIGS. 20 and 21, where one or more of the outlets 64 may be a USB port 864 or an arrangement of multiple USB ports 864. The convenience of USB compliant outlet ports has been carried over to standard wall plates of the type used with receptacles provided in a wall structure. See for example U.S. Pat. No. 6,943,296 issued Sep. 13, 2005 to BellSouth. U.S. Pat. No. 6,943,296 discloses a USB wall plate having circuitry that allows live USB ports to be placed throughout a building structure. U.S. Pat. No. 6,943,296 relies upon electrical power to daisy chain USB ports so as to allow use of these ports not only for low voltage DC power purposes, but also for data transmission. The electrical pop out device 10 foregoes the need for utilizing these data conductors in a typical USB port, and instead provides only the DC voltage in each of the USB ports 864. This distinction is important because the five volt DC output from a USB outlet port can of course be used to charge portable electrical devices. The electrical pop out device 10 provides only power to the DC voltage lines of a USB port 864. Accordingly, the data lines in the USB ports 864 are inactive and the USB ports 864 do not exchange data signals. Components of the embodiment of the pop put device 10 shown in FIGS. 20 and 21 are numbered similarly to like components of the embodiment of the pop out device shown in FIGS. 1-19.

As shown in FIGS. 20 and 21, the electrical pop out device 10 may be configured to convert AC electrical power to a desired DC power and to provide DC power to the one or more USB ports 864. As shown in FIG. 21, the one or more USB ports 864 of the outlet housing 14 are connected to an AC/DC converter 220, which is connected to an AC power source 400 (e.g., 110 volt 60 cycle AC power) via a cable (not shown). FIG. 21 schematically illustrates the AC power source 400 (e.g., 110 volt 60 cycle AC power) connected to the AC/DC converter 220. The connection between the AC/DC converter 220 and the AC power source 400 may be made via the contacts 66, 68 and 70, the spring connectors 72, or the electrical connectors 112 of the electrical pop out device 10. Alternatively, the connection between the AC/DC converter 220 and the AC power source 400 may be made directly to an AC power cable not shown.

Due to electrical losses in the length of USB cabling required to wire a typical building structure, boosting of the DC voltage to the "design" five volts for USB cabling is generally required. U.S. Pat. No. 6,943,296 is incorporated by reference herein as illustrative of one such boosting arrangement. The electrical pop out device 10 obviates the need for boosting DC voltages at such USB ports. More particularly, switch means 450 is provided to avoid any requirement for boosting the DC voltage. As a result of switching the USB ports 864 between an "OFF" condition and an "ON" condition by selectively energizing the USB ports and selectively activating the AC/DC converter 220 to transform and rectify AC voltage to DC voltage, the USB ports 864 have ready access to converted DC voltage in an energy efficient way.

As shown schematically in FIG. 21, the AC/DC converter 220 may be connected to the AC power source 400 (e.g., 110 volt 60 cycle AC power) via a switch means 450. The connection between the switch means 450 and the AC power source 400 may be made via the contacts 66, 68 and 70, the spring connectors 72, or the electrical connectors 112 of the electrical pop out device 10. Alternatively, the connection between the switch means 450 and the AC power source 400 may be made directly to an AC power cable not shown. The switch means 450 selectively connects the AC/DC converter 220 to the AC power source 400 (i.e., switches input AC power ON/OFF). Accordingly, the USB ports 864 connected to AC/DC converter are selectively energized by the switch means 450.

In some embodiments, the switch means 45 may be configured to be actuated by the movement of the outlet housing 14 with respect to the shroud 26. For instance, when the outlet housing 14 is an expanded position extending out from the shroud 26, the switch means 45 may be actuated to connect the AC/DC converter 220 to the AC power source 400 (i.e., activate the AC/DC converter 220) so that the USB ports 864 are energized. When the outlet housing 14 is in a compressed position inside the shroud 26, the switch means 45 may be actuated to disconnect the AC/DC converter 220 from the AC power source 400 (i.e., deactivate the AC/DC converter 220) so that the USB ports 864 are not energized. Thus, when the outlet housing 14 is in the expanded position and the one or more USB outlets 864 are accessible, the AC/DC converter is activated by the switch means 450 and the USB outlets 864 are energized. And when the outlet housing 14 is in the compressed position and the USB outlets are not accessible, the AC/DC converter is deactivated by the switch means 450 and the USB outlets 864 are not energized.

Accordingly, the switch means 450 saves electricity that would otherwise be continuously delivered to and consumed by the AC/DC converter 220. Described below are various other mechanisms that may be implemented for actuating the switch means 450 to turn the AC/DC converter 220 "ON" and "OFF." Also, other features are disclosed below that may be implemented in combination with the USB ports 864.

Figure 22:
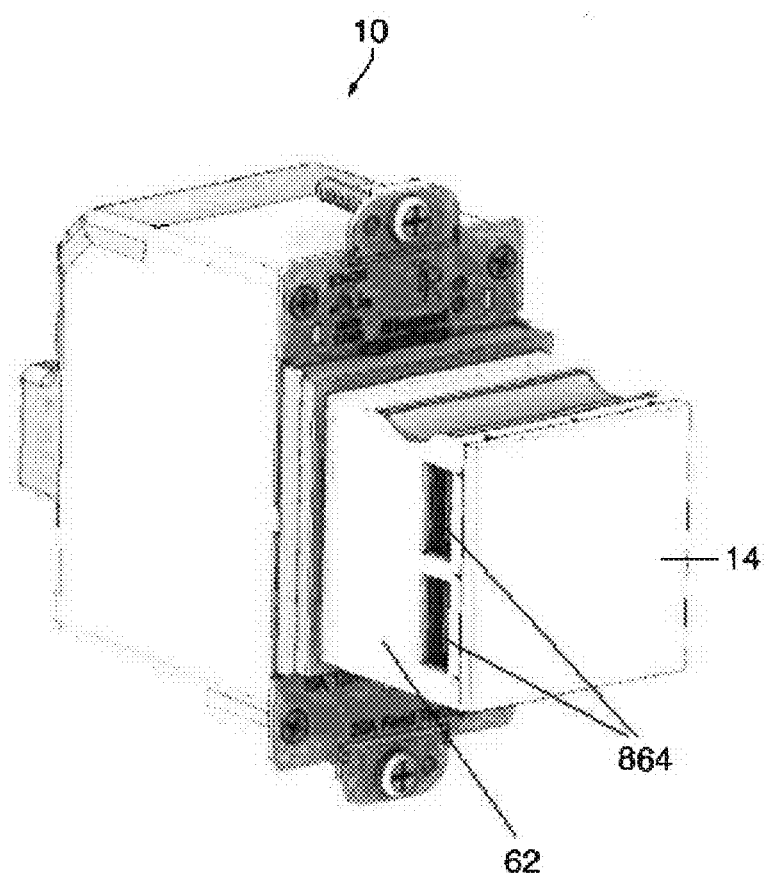
FIG. 22 is a perspective view of another embodiment of an electrical pop out device with an outlet housing being in an expanded position.

FIG. 22 shows a possible configuration of the electrical pop out device 10, where the outlets 64 are two USB ports 864 provided on a side face 62 of the outlet housing 14.

Figure 23:
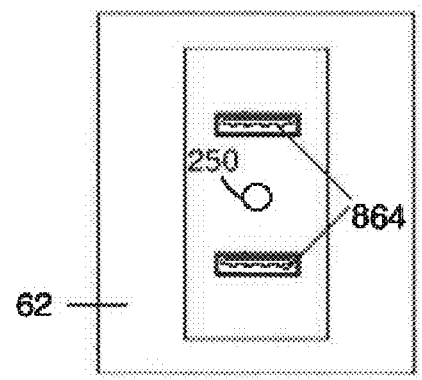
FIG. 23 is a view of an exemplary USB port configuration of an electrical pop out device.
Figure 24:
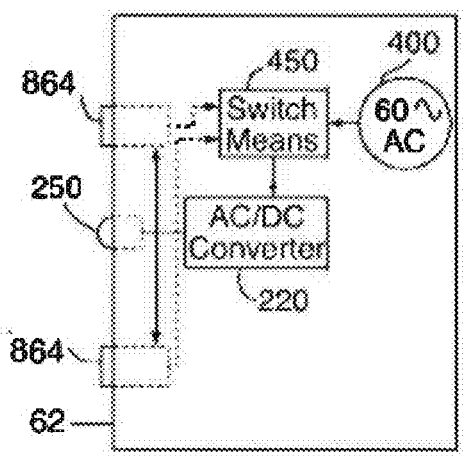
FIG. 24 is a schematic illustration of the USB port configuration of FIG. 23.

FIG. 23 shows a possible configuration for installing a USB port 864 in a side face 62 of the outlet housing 14. As shown in FIG. 23, one or more USB ports 864 with an LED lamp 250 to indicate when the one or more USB ports 864 are energized. FIG. 23 shows the USB ports 864 of FIG. 23 in greater detail, with connections for a 110 volt AC power cable (not shown). FIG. 24 shows a schematic illustration of the 110 volt 60 cycle AC power 400 being switchable to selectively energize the AC/DC converter 220.

The USB ports 864 may be mounted in the electrical pop out device 10 for limited translational or inward sliding motion, for alternatively switching input AC power, through switch means 450, to the AC/DC converter 220. The USB ports 864 are mounted slidably in a side face 62 of the electrical pop out device 10 and act as push button switches for the switching means 450 to selectively connect the output of the AC/DC converter 220 to the power conductors of a USB cable (not shown) when a cable end is pushed into one or more USB ports 864. Thus, insertion of a USB plug (not shown) into a USB port 864, switches the AC/DC converter ON. Withdrawal of the USB plug will reverse the switch means 450 causing the AC/DC converter 220 and USB ports 864 to be deenergized. The LED or lamp 250 will provide visual indication if the AC/DC converter 220 condition is ON/OFF.

Figures 25, 26:
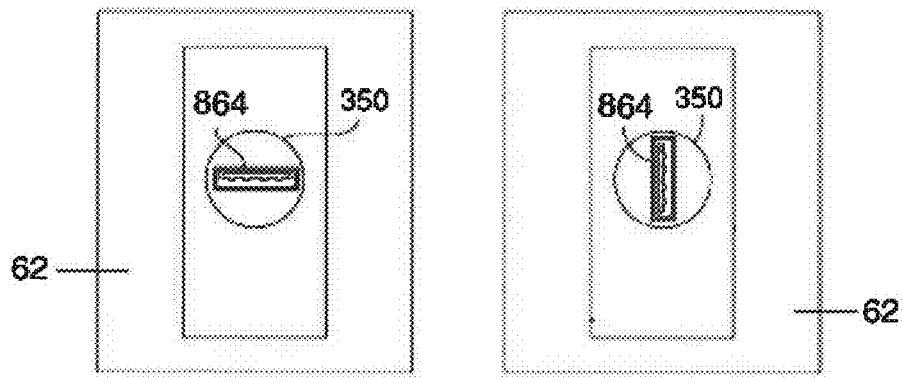
FIG. 25 is a view of another exemplary USB port configuration of an electrical pop out device.
FIG. 26 is another view of the exemplary USB port configuration of FIG. 25.
Figure 27:
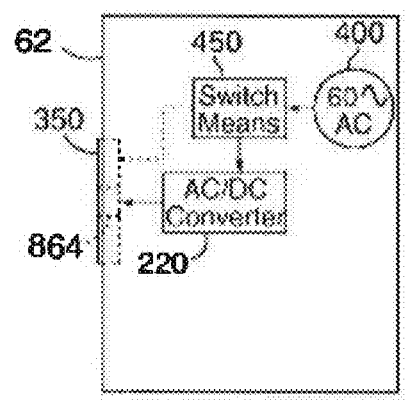
FIG. 27 is a schematic illustration of the USB port configuration of FIG. 25.

FIGS. 25-27 show another possible configuration for installing a USB port 864 in the side face 62 of the outlet housing 14. But instead of the USB port 864 being pushed in to actuate the switch means 450 to switch the DC output of the AC/DC converter 220 ON/OFF, the USB port 864 is configured to be rotated 90° from the position shown in FIG. 25 to the position shown in FIG. 26 to switch the AC/DC converter 220 ON/OFF. A rotatable collar 350 houses the USB port 864 in a side face 62 of the electrical pop out device 10.

Figure 28:
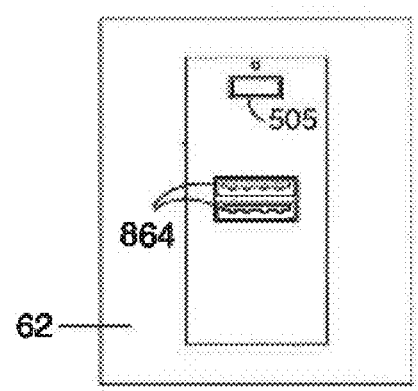
FIG. 28 is a view of another exemplary USB port configuration of an electrical pop out device.
Figure 29:
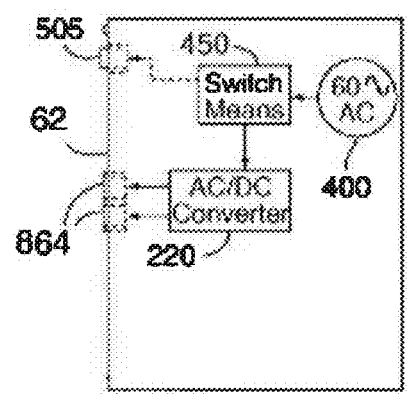
FIG. 29 is a schematic illustration of the USB port configuration of FIG. 28.

FIGS. 28 and 29 show another possible configuration for installing a USB port 864 in the side face 62 of the outlet housing 14. As shown in FIGS. 28 and 29, the electrical pop out device 10 may have one or more USB ports 864 and a manual switch 505 for selectively connecting the one or more USB ports 864 to the output of an AC/DC converter 220.

Figures 30, 31:
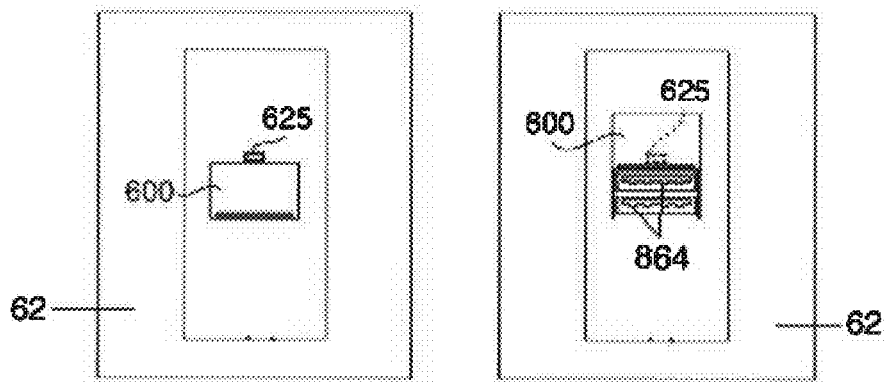
FIG. 30 is a view of another exemplary USB port configuration of an electrical pop out device.
FIG. 31 is another view of the exemplary USB port configuration of FIG. 30.
Figure 32:
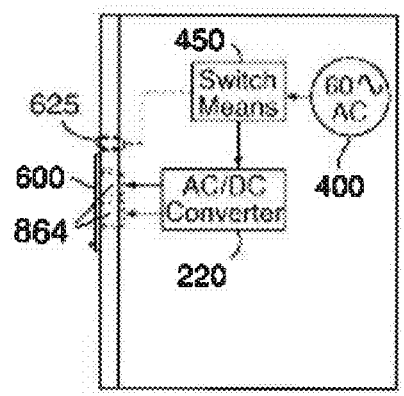
FIG. 32 is a schematic illustration of the USB port configuration of FIG. 30.

FIGS. 30-32 show another possible configuration for installing the USB port 864 in the side face 62 of the outlet housing 14. As shown in FIGS. 30-32, the electrical pop out device 10 may have one or more USB ports 864 and a gate or cover 600 USB, which is configured to be moved between an open and closed position to actuate the switch means 450. This structure results in a safety feature since the USB ports 864 cannot be accessed except by raising this gate or cover 600. The USB cable plugged into the USB port 864 serves to hold the gate or cover 600 open to actuate the switch means 450 to activate the AC/DC converter 220. Further, removal of the USB cable causes the gate 600 to close and actuate the switch means 450 to deactivate the AC/DC converter 220.

Although certain features of the embodiments of FIGS. 20-32 have been described in connection with some embodiments but not others, it will be apparent to those skilled in the art that the features described herein may be implemented in various combinations.

In some embodiments of the electrical pop out device 10, the electrical outlets 64 may be configured to provide DC voltages selected from a range of common DC voltages, including, but not limited to, 12 volts, 9 volts, 7½ volts, 5 volts, etc. For example, in some embodiments, USB ports 864 may be provided for delivering 5 volts at various electric currents. Feedback circuitry may be provided for coupling the appropriate electrical current to the devices to be powered or charged. A data feedback loop may be provided through conventional USB ports to not only provide the appropriate charging current at the USB ports 864, but to monitor the current provided to a battery in a portable device connected to these "intelligent" USB ports. In order to maintain appropriate voltage to a charging battery, the voltage is provided above whatever low voltage shut off level is built into the portable devices itself. For example, U.S. Pat. No. 7,034,503 issued Apr. 25, 2006 and entitled Circuit and Method of Operation for an Adaptive Charge Rate Power Supply, provides a more complete disclosure of one possible configuration for this monitoring circuitry. U.S. Pat. No. 7,034,503 is incorporated by reference herein in its entirety.

Figure 33:
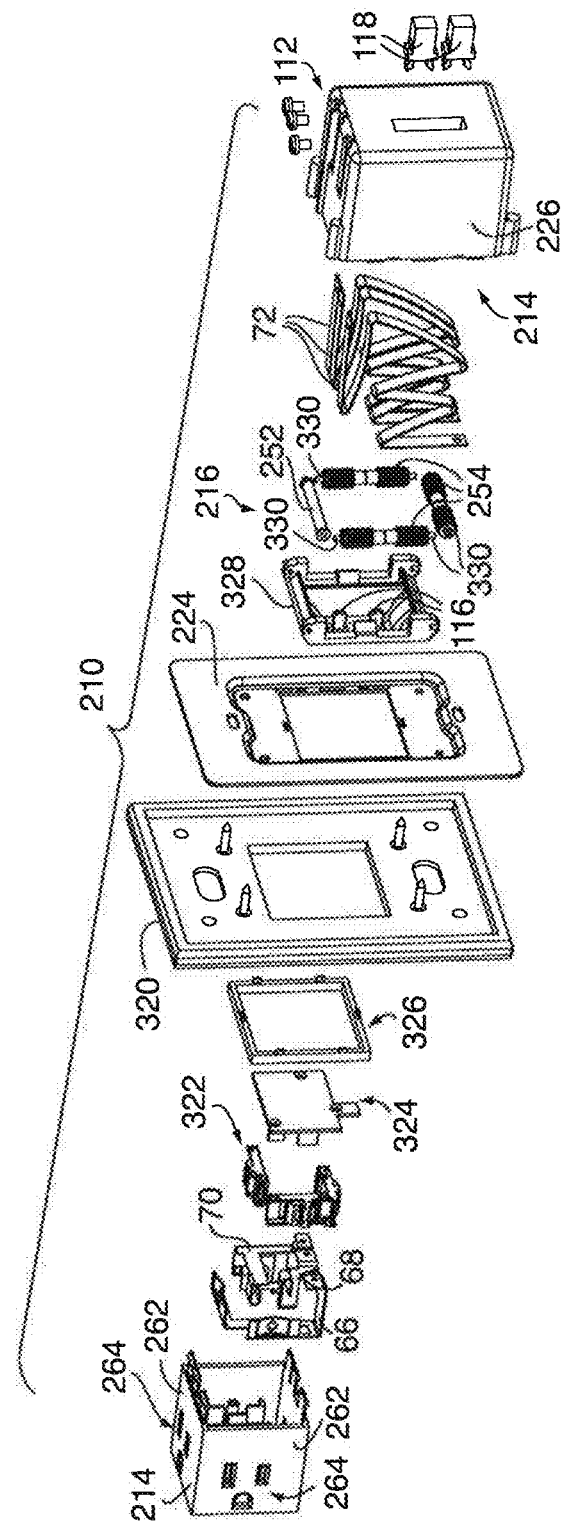
FIG. 33 is an exploded view of an electrical pop out device according to another embodiment.
Figure 34:
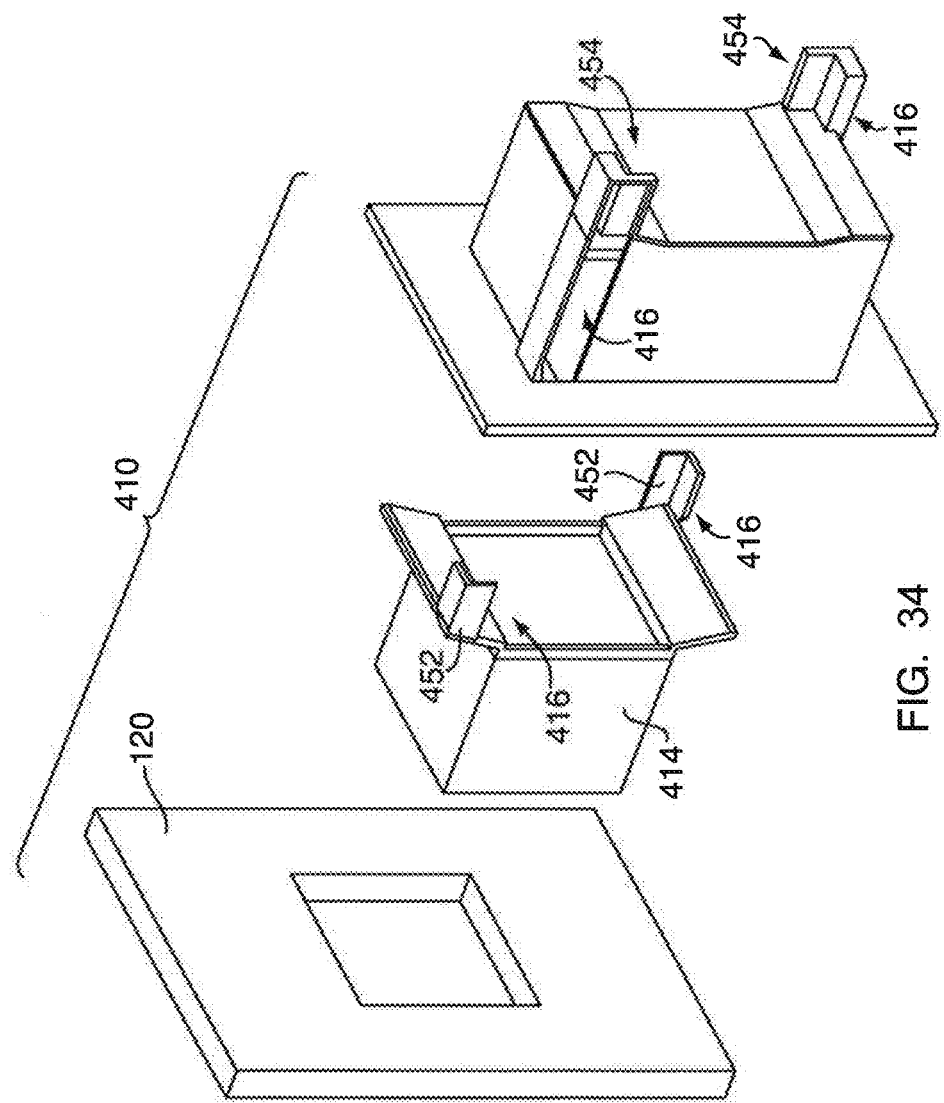
FIG. 34 is a rear exploded prospective view of an electrical pop out device having a guidance mechanism according to another embodiment.
Figure 35:
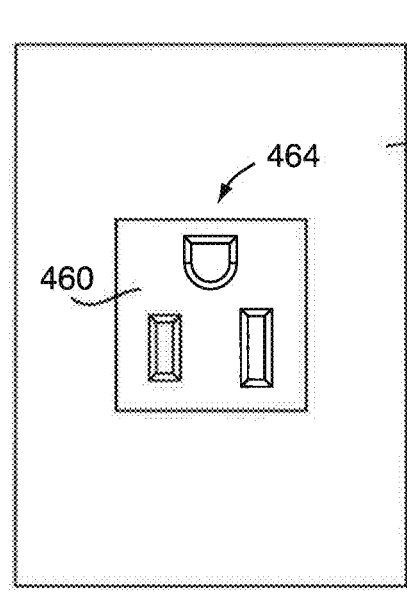
FIG. 35 is a front view of the electrical pop out device of FIG. 34.
Figure 36:
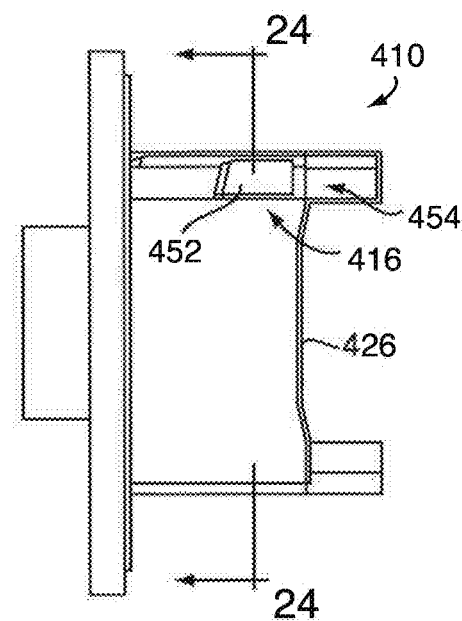
FIG. 36 is a side view of the electrical pop out device of FIG. 34-35.
Figure 37:
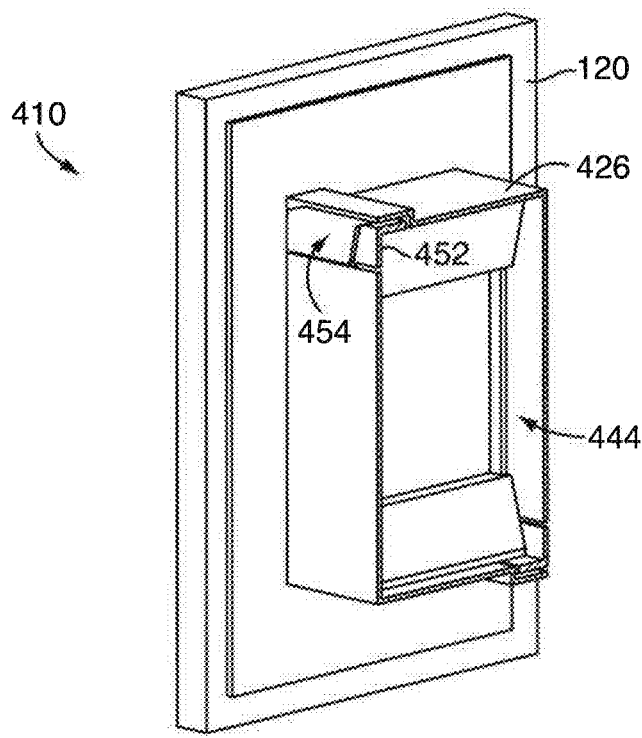
FIG. 37 is a partial cutaway view of the electrical pop out device taken along line 24-24 of FIG. 36.

Another embodiment of an electrical pop out device 210 is shown in FIG. 33, wherein similar components are numbered similarly to like components shown in FIGS. 1-19, except as noted. An outlet housing 214 has multiple outlets 264 located on side faces 262. The electrical pop out device 210 includes tamper resistant shutters 326, as, for example, manufactured and sold by Pass and Seymour in Syracuse, N.Y., at each of the outlets 264. A connector plate 324 and housing frame 326 retain the contacts 66, 68, 70 and the tamper resistant shutters 322 within the outlet housing 214.

A guidance mechanism 216 is connected with the outlet housing 214 and allows the outlet housing 214 to move into and out of a shroud 226. The guidance mechanism 216 is retained within the shroud 226 by a sub-plate 224, which may be covered with a faceplate 320. The guidance mechanism 216 includes a retention frame 328, guide rollers 252, and pinion gears 254. The guide rollers 252 and the pinion gears 254 are connected to the retention frame 328 with pins 330.

Referring to FIGS. 34-37, another embodiment of an electrical pop out device 410 is shown. Similar components of the electrical pop out device 410 are numbered similarly to like components shown in FIGS. 1-33, except as noted. A guidance mechanism 416 includes a plurality of slides 452 located about an outlet housing 414. Each slide 452 is nested within a slot 454 that extends back from an opening 444 of a shroud 426. The outlet housing 414 includes a single outlet 464 located on the front face 460 of the outlet housing 414.

Figure 38:
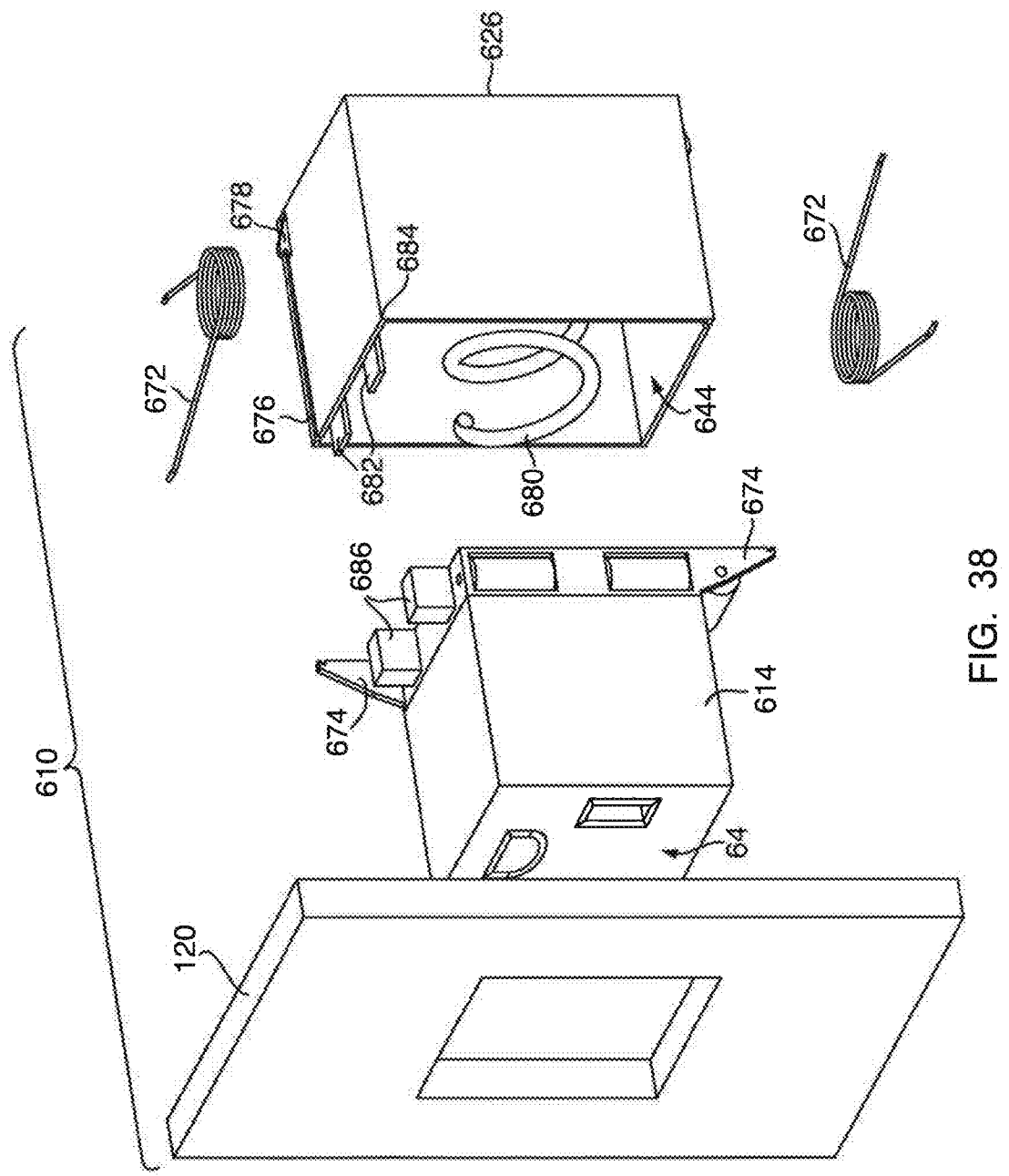
FIG. 38 is a front exploded prospective view of an electrical pop out device having a guidance mechanism according to another embodiment.
Figure 39:
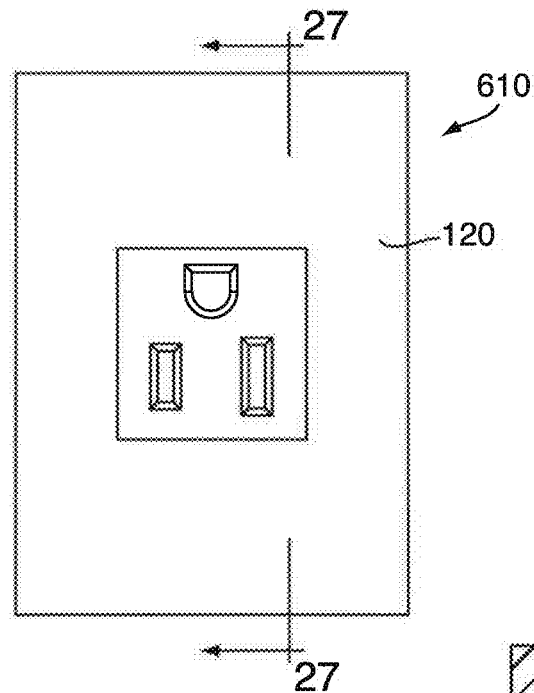
FIG. 39 is a front view of the electrical pop out device of FIG. 38.
Figure 40:
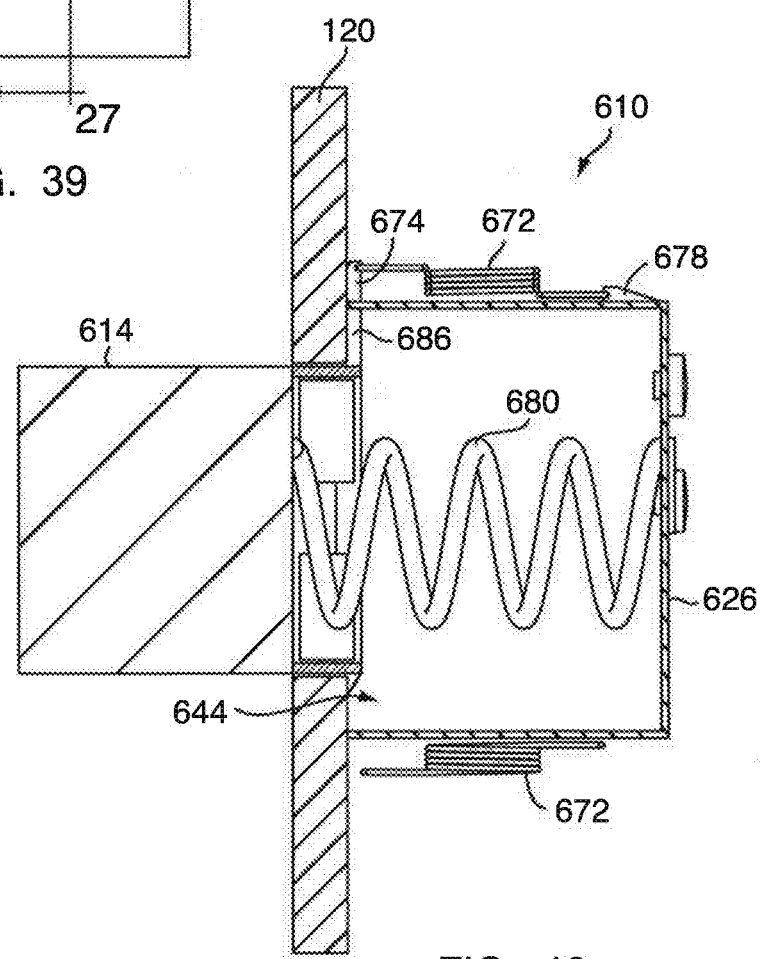
FIG. 40 is a section view of the electrical pop out device taken along line 27-27 of FIG. 39.

Referring to FIGS. 38-40, another embodiment of an electrical pop out device 610 is shown. Similar components of the electrical pop out device 610 are numbered similarly to like components shown in FIGS. 1-37, except as noted. An outlet housing 614 includes a pair of slides 674 that extend through slots 676 in the shroud 626. Each slot 676 extends back from the opening 644 of the shroud 626. Each of the slides 674 is connected with a stop 678 on the shroud 626 by a torsion spring 672.

The outlet housing 614 and the shroud 626 are electrically connected. A ground wire 680 connects the shroud 626 with the outlet housing 614. The shroud 626 has a pair of L-shaped electrical connectors 682 that extend along the top 684 of the shroud 626. Each of the L-shaped electrical connectors 682 is connected to the contacts within the outlet housing 614 through a set of brushes 686 that extend upward from the outlet housing 614 and into the L-shaped electrical connectors 682.

Referring to FIGS. 41-44, another embodiment of an electrical pop out device 810 is shown. Similar components of the electrical pop out device 810 are numbered similarly to like components shown in FIGS. 1-40, except as noted. A guidance mechanism 816 includes at least one slide 874 disposed on the outlet housing 814 and at least one guide 875 disposed on the shroud 826. The outlet housing 814 and the shroud 826 each define at least one slot 876 and 877, respectively. The at least one slide 874 extends outward from the outlet housing 814 and is sized and shaped to interact with the at least one slot 877 of the shroud 814. The at least one guide 875 extends inward from the shroud 826 and is sized and shaped to interact with the at least one slot 876 defined of the outlet housing 814.

Figure 41:
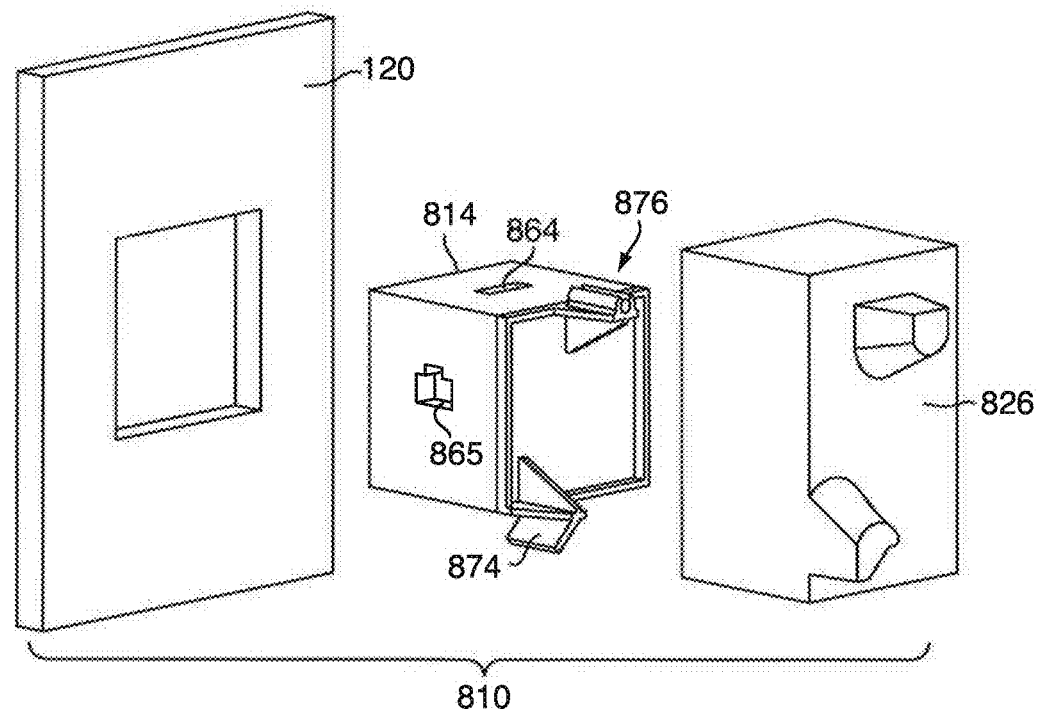
FIG. 41 is a rear exploded prospective view of an electrical pop out device having a guidance mechanism according to another embodiment.
Figure 42:
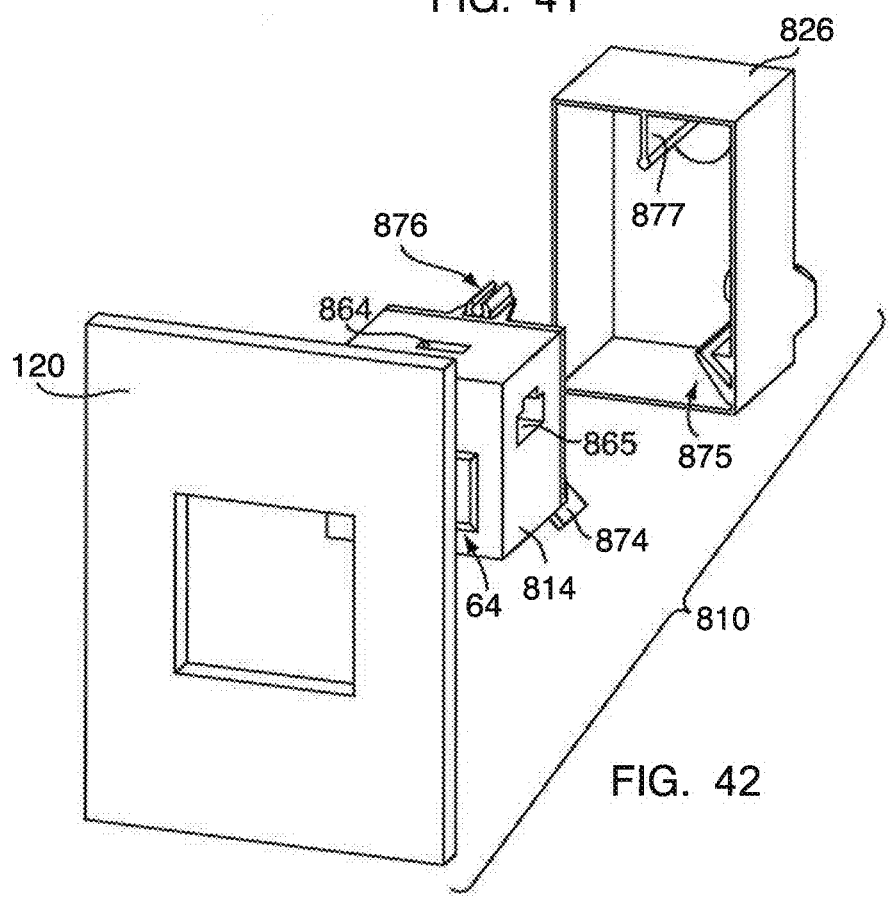
FIG. 42 is a front exploded prospective view of the electrical pop out device of FIG. 41.
Figure 43:
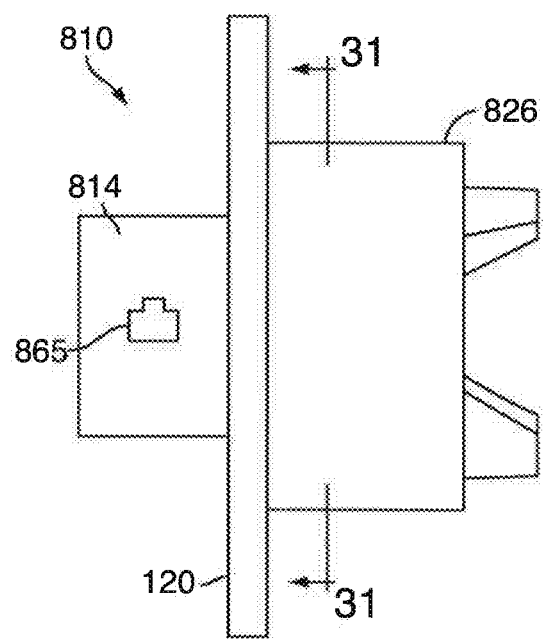
FIG. 43 is a side view of the electrical pop out device of FIG. 41-42.
Figure 44:
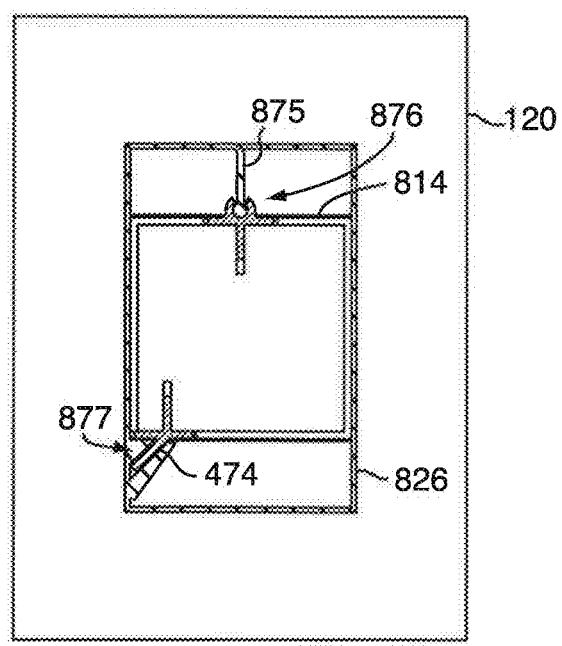
FIG. 44 is a section view of the electrical pop out device taken along line 31-31 of FIG. 43.
Figure 45:
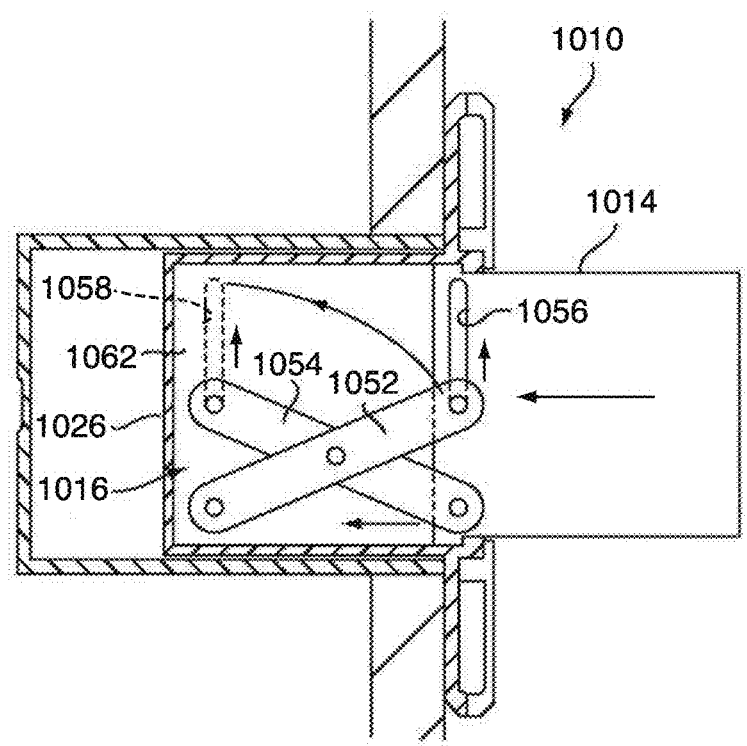
FIG. 45 is a side partial cutaway view of the electrical pop out device having a guidance mechanism according to another embodiment.

It is contemplated that electrical connections and devices other than the outlets described above may be incorporated into the electrical pop out device. Other electrical connections and devices that may be incorporated include telephone connectors, one or more lights, cable connectors, Universal Serial Bus (USB), or the like, and any combination of these or other electrical connections and devices. Still further, a push-push latch may be replaced with another type of latch. Specifically, FIGS. 41-43 illustrate the traditional electrical outlet connection 64, along with a USB port 864 and a telephone connection 865, and Referring to FIG. 45, another embodiment of an electrical pop out device 1010 is shown. Similar components of the electrical pop out device 1010 are numbered similarly to like components shown in FIGS. 1-44, except as noted. A guidance mechanism 1016 includes at least one pair of a first cross link 1052 and a second cross link 1054 along one side face 1062 of an outlet housing 614. The first cross link 1052 is pivotally attached to the shroud 1026 and moveably pinned in a slot 1056 that extends along the outlet housing 1014. The second cross link 1054 is pivotally attached to the outlet housing 1014 and movably pinned in a slot 1058 that extends along the shroud 1026.

One major advantage of the electrical pop out device 10, 210, 410, 610, 810, 1010 is that the outlet housing 14, 214, 614, 814, 1014 can be retracted into the wall to eliminate exposed, unused outlets 64. Thus, the electrical pop out device 10, 210, 610, 810, 1010 can retain the outlets 64 within the wall and present the outlets 64 to the user only when actuated. The spring connector 72 allows movement of the outlet housing 14 in both an inward and outward direction with respect to the shroud 26, 226, 426, 626, 826, 1010. As a result, the outlets 64 are also safer.

Another major advantage of the electrical pop out device 10 is that the outlets 64 are accessed from different directions. As a result, more outlets 64 can be located in a given space. Further, plugs with relatively large plugheads may be used without covering other outlets 64, which would render the other outlets 64 unusable.

Another advantage is that the electrical pop out device 10, 210, 410, 610, 810, 1010 is sufficiently compact and dimensioned to fit and operate within the standard single wall box 22, which allows it to be retrofit into existing structures. This device will also fit into any standard multiple gang arrangement. The electrical pop out device 10, 210, 410, 610, 810, 1010 is also an option for new construction, since the electrical pop out device 10, 210, 410, 610, 810, 1010 does not require substantive changes to the building plans.

A further advantage of the electrical pop out device 10, 210, 410, 610, 810, 1010 is that the electrical pop out device 10, 210, 410, 610, 810, 1010 is installed substantially flush with the wall to aesthetically hide the outlets 64, while allowing access to multiple outlets 64 from different directions when the outlet housing 14, 214, 614, 814, 1014 is in a expanded position.

It is contemplated that the electrical pop out device 10, 210, 410, 610, 810, 1010 may include a ground-fault circuit interrupter as commonly known in the art.

Although the electrical pop out device 10 has been shown and described with respect to exemplary embodiments thereof, it should be understood by those skilled in the art that various changes, omissions, and additions may be made thereto, without departing from the spirit and scope of the invention. For example, although as disclosed each rack gear is in contact with a single pinion gear, multiple pinion gears may be used along each rack to distribute load and to increase durability.

What is claimed is:

1. An electrical pop out device comprising:
    a shroud;
    an outlet housing being sized to be placed inside the shroud, the outlet housing comprising one or more USB ports;
    an AC to DC converter coupled to the one or more USB ports for providing low voltage DC power;
    a guidance mechanism connecting the outlet housing with the shroud, the guidance mechanism being configured to allow movement of the outlet housing with respect to the shroud and to prevent misalignment of the outlet housing with respect to the shroud during movement of the outlet housing; and
    a switch coupled to the AC to DC converter, the switch being configured to selectively activate the AC to DC converter to energize the one or more USB ports;
    wherein the switch is configured to be mechanically actuated by insertion of a USB plug into at least one of the one or more USB ports to selectively activate the AC to DC converter to energize the one or more USB ports.

2. The electrical pop out device according to claim 1, wherein the switch is configured to be actuated by withdrawal of the USB plug from the at least one of the one or more USB ports to cause the AC to DC converter and the one or more USB ports to become deenergized.

3. The electrical pop out device according to claim 1, further comprising a spring connector electrically coupling the shroud to the outlet housing, the spring connector being configured to mechanically expel the outlet housing from within the shroud and to retain the outlet housing in an expanded position.

4. The electrical pop out device according to claim 1, wherein the guidance mechanism includes multiple rack and pinion gear sets, each rack and pinion gear set having at least one rack gear and at least one pinion gear, the outlet housing being moveable with respect to the shroud along a direction defined by the rack gears.

5. The electrical pop out device according to claim 4, wherein at least two rack and pinion gear sets are diametrically opposed about the outlet housing, or are orthogonally arranged about the outlet housing.

6. The electrical pop out device according to claim 4, wherein the pinion gears of each rack and pinion gear set are rotatably attached to the outlet housing.

7. The electrical pop out device according to claim 6, wherein the guidance mechanism additionally comprises a retention frame attached to the outlet housing.

8. The electrical pop out device according to claim 7, wherein the pinion gears are rotatably attached to the outlet housing by the retention frame.

9. The electrical pop out device according to claim 4, wherein the rack gears of each rack and pinion gear set are disposed on the shroud and extend from an opening in the shroud straight back into an interior of the shroud.

10. The electrical pop out device according to claim 9, wherein at least three independent rack gears are arranged on at least three mutually orthogonal planes to resist twisting of the outlet housing by a combination of resultant reaction vectors aligned with the gear sets.

11. The electrical pop out device according to claim 1, wherein the one or more USB ports are slidably supported in the outlet housing and are configured to slide and mechanically actuate the switch to selectively activate the AC to DC converter to energize the one or more USB ports when the USB plug is inserted into the one or more USB ports.

12. An electrical pop out device comprising:
    a shroud;
    an outlet housing being sized to be placed inside the shroud, the outlet housing comprising one or more USB ports;
    an AC to DC converter coupled to the one or more USB ports for providing low voltage DC power;
    a guidance mechanism connecting the outlet housing with the shroud, the guidance mechanism being configured to allow movement of the outlet housing with respect to the shroud and to prevent misalignment of the outlet housing with respect to the shroud during movement of the outlet housing;
    a switch coupled to the AC to DC converter, the switch being configured to selectively activate the AC to DC converter to energize the one or more USB ports; and
    a cover configured to be moved between a closed position, where the cover blocks access to at least one of the one or more USB ports, and an open position, where the cover permits access to the at least one of the one or more USB ports;
    wherein the cover is configured to actuate the switch to selectively activate the AC to DC converter to energize the one or more USB ports when moved from the closed position to the open position.

13. The electrical pop out device according to claim 12, further comprising a spring having a first portion coupled to the shroud and a second portion coupled to the outlet housing, the first portion being substantially perpendicular to the second portion, the first portion and the second portion being configured to expand and contract along perpendicular directions, the spring being configured to expel the outlet housing from within the shroud and to provide an electrical connection to the outlet housing from the shroud.

14. The electrical pop out device according to claim 12, further comprising a spring connector electrically coupling the shroud to the outlet housing, the spring connector being configured to mechanically expel the outlet housing from within the shroud and to retain the outlet housing in an expanded position.

15. The electrical pop out device according to claim 12, wherein the guidance mechanism includes multiple rack and pinion gear sets, each rack and pinion gear set having at least one rack gear and at least one pinion gear, the outlet housing being moveable with respect to the shroud along a direction defined by the rack gears.

16. The electrical pop out device according to claim 15, wherein the pinion gears of each rack and pinion gear set are rotatably attached to the outlet housing.

17. The electrical pop out device according to claim 16,
wherein the guidance mechanism additionally comprises
a retention frame attached to the outlet housing; and
wherein the pinion gears are rotatably attached to the outlet housing by the retention frame.

18. The electrical pop out device according to claim 12, wherein the guidance mechanism includes a plurality of slides located about and extending from the outlet housing, each of the plurality of slides being nested in a slot defined in the shroud.

19. The electrical pop out device according to claim 12, wherein the guidance mechanism includes at least a pair of cross links, a first cross link being pinned to the shroud and being movably pinned within a slot defined in the outlet housing, a second cross link being pinned to the outlet housing and being movably pinned within a slot defined in the shroud.

20. The electrical pop out device according to claim 12, further comprising a push-push latch operatively connected with the shroud and the outlet housing.

21. The electrical pop out device according to claim 12, wherein the outlet housing includes at least a pair of outlets placed about the outlet housing to provide access to each of the pair of outlets from different directions.

* * * * *